US008629889B2

(12) United States Patent
Eom

(10) Patent No.: US 8,629,889 B2
(45) Date of Patent: Jan. 14, 2014

(54) DISPLAY DEVICE AND DRIVING METHOD THEREOF

(75) Inventor: Ki-Myeong Eom, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 248 days.

(21) Appl. No.: 13/015,520

(22) Filed: Jan. 27, 2011

(65) Prior Publication Data

US 2011/0193892 A1 Aug. 11, 2011

(30) Foreign Application Priority Data

Feb. 5, 2010 (KR) .................. 10-2010-0011146

(51) Int. Cl.
*G09G 5/10* (2006.01)
(52) U.S. Cl.
USPC .......................................................... 345/690
(58) Field of Classification Search
USPC ..................... 345/690, 204, 87, 67
See application file for complete search history.

(56) References Cited

U.S. PATENT DOCUMENTS

| 7,710,410 | B2 * | 5/2010 | Shimizu | 345/204 |
| 7,999,800 | B2 * | 8/2011 | Iwabuchi et al. | 345/204 |
| 8,416,157 | B2 | 4/2013 | Lee et al. | |
| 2007/0222718 | A1 * | 9/2007 | Takahara | 345/76 |
| 2009/0322216 | A1 * | 12/2009 | Yanagihara | 313/504 |
| 2012/0212500 | A1 * | 8/2012 | Mori et al. | 345/589 |

FOREIGN PATENT DOCUMENTS

| CN | 101251981 A | 8/2008 |
| CN | 101256735 A | 9/2008 |
| JP | 2003-122304 | 4/2003 |
| JP | 2005-037849 | 2/2005 |
| KR | 10-2002-0092802 | 12/2002 |
| KR | 10-2003-0024601 | 3/2003 |
| KR | 10-2005-0083497 | 8/2005 |
| KR | 1020080048223 A | 6/2008 |

* cited by examiner

*Primary Examiner* — William Boddie
*Assistant Examiner* — Leonid Shapiro
(74) *Attorney, Agent, or Firm* — Christie, Parker & Hale, LLP

(57) ABSTRACT

A display device and a driving method to reduce power consumption, and to simplify the process of manufacturing the display device by configuring a driver made of PMOS transistors, is disclosed. The display device includes a display unit and a light emission driver. The display unit includes scan lines for transmitting scan signals, data lines for transmitting data signals, light emitting signal lines for transmitting light emitting signals, and pixels coupled to the scan lines, data lines, and light emitting signal lines. The light emission driver is for receiving a partial driving selection signal for selecting one of a normal driving mode or a partial driving mode, an area selection signal for dividing the display unit into a display area and a non-display area, a synchronization signal generated in synchronization with a vertical synchronization signal, and first and second light emitting clock signals, for outputting the light emitting signals.

18 Claims, 14 Drawing Sheets

DISPLAY DEVICE AND DRIVING METHOD THEREOF

CROSS-REFERENCE TO RELATED APPLICATION

This application claims priority to and the benefit of Korean Patent Application No. 10-2010-0011146, filed in the Korean Intellectual Property Office on Feb. 5, 2010, the entire content of which is incorporated herein by reference.

BACKGROUND

1. Field

Aspects of embodiments according to the present invention relate to a display device and a driving method thereof. More particularly, aspects of embodiments of the present invention relate to an organic light emitting diode (OLED) display and a driving method thereof.

2. Description of Related Art

A display device includes a display panel constituted by a plurality of pixels arranged in a matrix. The display panel includes a plurality of scan lines formed in a row direction and a plurality of data lines formed in a column direction. The plurality of scan lines and the plurality of data lines cross each other. Each of the plurality of pixels is driven by a scan signal and a data signal transmitted from a corresponding scan line and data line.

Display devices are classified into a passive matrix type of light emitting display device and an active matrix type of light emitting display device according to a driving scheme of the pixels. Of these, the active matrix type, in which unit pixels are selectively lit, is used more than the passive matrix type because of its better resolution, contrast, and operation speed.

Display devices are used with portable information terminals such as personal computers, mobile phones, PDAs, or the like, as well as monitors for various types of information equipment. Known display devices include LCD devices using liquid crystal panels, organic light emitting display devices using organic light emitting diodes (OLEDs), PDPs using plasma panels, etc. In recent years, various light emitting display devices having smaller weight and volume than cathode ray tube devices have been developed. In particular, organic light emitting display devices, having excellent emission efficiency, luminance, and viewing angle as well as rapid response speed, have attracted public attention.

The organic light emitting diode (OLED) display supplies current according to input image data to a plurality of OLEDs disposed in the display panel, thereby displaying images. In a typical display panel, in a driving period in which a display unit is divided into a display area and a non-display area, the scan lines and data lines corresponding to the non-display area are applied with scan signals and data signals like the display area. This generates unnecessary power consumption such that the overall power consumption is increased.

The above information disclosed in this Background section is only for enhancement of understanding of the background of the invention and therefore it may contain information that does not form the prior art that is already known in this country to a person of ordinary skill in the art.

SUMMARY

Embodiments of the present invention reduce power consumption, and simplify a production process by configuring a driver made of only PMOS transistors for driving a display device.

According to an exemplary embodiment of the present invention, a display device is provided. The display device includes a display unit and a light emission driver. The display unit includes a plurality of scan lines, a plurality of data lines, a plurality of light emitting signal lines, and a plurality of pixels. The scan lines are for transmitting a plurality of scan signals. The data lines are for transmitting a plurality of data signals. The light emitting signal lines are for transmitting a plurality of light emitting signals. The pixels are coupled to the scan lines, the data lines, and the light emitting signal lines. The light emission driver is for receiving a partial driving selection signal, an area selection signal, a synchronization signal, and first and second light emitting clock signals. The light emission driver is for outputting the light emitting signals. The partial driving selection signal is for selecting one of a normal driving mode or a partial driving mode. The area selection signal is for dividing the display unit into a display area and a non-display area. The synchronization signal is generated in synchronization with a vertical synchronization signal. The second light emitting clock signal has a phase difference from the first light emitting clock signal. The light emission driver includes a plurality of normal drivers and a plurality of partial drivers. The normal drivers are respectively coupled to a plurality of first light emitting signal lines among the light emitting signal lines. The first light emitting signal lines correspond to the non-display area. The normal drivers are for outputting a plurality of first light emitting signals among the light emitting signals at an on voltage level under the normal driving mode. The normal drivers are for outputting the first light emitting signals at an off voltage level under the partial driving mode. The partial drivers are respectively coupled to the second light emitting signal lines among the light emitting signal lines. The second light emitting signal lines correspond to the display area. The partial drivers are for outputting a plurality of second light emitting signals among the light emitting signals at the on voltage level according to the area selection signal.

The normal drivers may include first and second normal drivers. The first normal driver is for receiving the first light emitting clock signal, the partial driving selection signal, and a first input signal. The first normal driver is for receiving the second light emitting clock signal in accordance with the first input signal when the partial driving selection signal is at a first level. The first normal driver is for generating a first shift signal according to the second light emitting clock signal. The first normal driver is for generating a first light emitting signal of the light emitting signals in which the first shift signal is inverted. The second normal driver is for receiving a second input signal, the partial driving selection signal, and the second light emitting clock signal. The second normal driver is for receiving the first light emitting clock signal in accordance with the second input signal when the partial driving selection signal is at the first level. The second normal driver is for generating a second shift signal according to the first light emitting clock signal. The second normal driver is for generating a second light emitting signal of the light emitting signals in which the second shift signal is inverted.

The first input signal may be one of the second shift signal or the synchronization signal.

The second input signal may be the first shift signal.

The first normal driver may include first through eleventh transistors and first and second capacitors. The first transistor includes a gate terminal for receiving the first light emitting clock signal and a second terminal for receiving the first input signal. The second transistor includes a gate terminal for receiving the partial driving selection signal, a first terminal coupled to a first power source, and a second terminal coupled to a first terminal of the first transistor. The third transistor includes a gate terminal for receiving the first light emitting clock signal and a first terminal coupled to the first power source. The first capacitor includes one terminal coupled to the second terminal of the second transistor and another terminal coupled to a second terminal of the third transistor. The fourth transistor includes a gate terminal coupled to the one terminal of the first capacitor, a first terminal coupled to the other terminal of the first capacitor, and a second terminal for receiving the second light emitting clock signal. The fifth transistor includes a gate terminal for receiving the partial driving selection signal, a first terminal coupled to the other terminal of the first capacitor, and a second terminal coupled to a second power source. The sixth transistor includes a gate terminal coupled to the other terminal of the first capacitor and a first terminal coupled to the first power source. The seventh transistor includes a gate terminal for receiving the first light emitting clock signal, a first terminal coupled to a second terminal of the sixth transistor, and a second terminal coupled to the second power source. The eighth transistor includes a gate terminal coupled to the second terminal of the sixth transistor and a first terminal coupled to the first power source. The ninth transistor includes a gate terminal coupled to the other terminal of the first capacitor, a first terminal coupled to a second terminal of the eighth transistor, and a second terminal coupled to the second power source. The tenth transistor includes a gate terminal coupled to the second terminal of the eighth transistor and a first terminal coupled to the first power source. The second capacitor includes one terminal coupled to the gate terminal of the eighth transistor and another terminal coupled to a second terminal of the tenth transistor. The eleventh transistor includes a gate terminal coupled to the one terminal of the second capacitor, a first terminal coupled to the other terminal of the second capacitor, and a second terminal coupled to the second power source.

The second normal driver may include first through eleventh transistors and first and second capacitors. The first transistor includes a gate terminal for receiving the second light emitting clock signal and a second terminal for receiving the second input signal. The second transistor includes a gate terminal for receiving the partial driving selection signal, a first terminal coupled to a first power source, and a second terminal coupled to a first terminal of the first transistor. The third transistor includes a gate terminal for receiving the second light emitting clock signal and a first terminal coupled to the first power source. The first capacitor includes one terminal coupled to the second terminal of the second transistor and another terminal coupled to a second terminal of the third transistor. The fourth transistor includes a gate terminal coupled to the one terminal of the first capacitor, a first terminal coupled to the other terminal of the first capacitor, and a second terminal for receiving the first light emitting clock signal. The fifth transistor includes a gate terminal for receiving the partial driving selection signal, a first terminal coupled to the other terminal of the first capacitor, and a second terminal coupled to a second power source. The sixth transistor includes a gate terminal coupled to the other terminal of the first capacitor and a first terminal coupled to the first power source. The seventh transistor includes a gate terminal for receiving the second light emitting clock signal, a first terminal coupled to a second terminal of the sixth transistor, and a second terminal coupled to the second power source. The eighth transistor includes a gate terminal coupled to the second terminal of the sixth transistor and a first terminal coupled to the first power source. The ninth transistor includes a gate terminal coupled to the other terminal of the first capacitor, a first terminal coupled to a second terminal of the eighth transistor, and a second terminal coupled to the second power source. The tenth transistor includes a gate terminal coupled to the second terminal of the eighth transistor and a first terminal coupled to the first power source. The second capacitor includes one terminal coupled to the gate terminal of the eighth transistor and another terminal coupled to a second terminal of the tenth transistor. The eleventh transistor includes a gate terminal coupled to the one terminal of the second capacitor, a first terminal coupled to the other terminal of the second capacitor, and a second terminal coupled to the second power source.

The partial drivers may include first and second partial drivers. The first partial driver is for receiving the first light emitting clock signal, the second light emitting clock signal, the area selection signal, an inverted area selection signal in which the area selection signal is inverted, the partial driving selection signal, and a third shift signal. The first partial driver is for generating a third light emitting signal of the light emitting signals at a second power source voltage according to the area selection signal when the partial driving selection signal is at a second level. The second level is different from the first level. The second partial driver is for receiving the first light emitting clock signal, the second light emitting clock signal, the area selection signal, the inverted area selection signal, and a fourth shift signal. The second partial driver is for generating a fourth light emitting signal of the light emitting signals at the second power source voltage according to the area selection signal.

The first partial driver may include first through fourteenth transistors and first and second capacitors. The first transistor includes a gate terminal for receiving the first light emitting clock signal and a second terminal for receiving the third shift signal. The second transistor includes a gate terminal for receiving the partial driving selection signal, a first terminal coupled to a first power source, and a second terminal coupled to a first terminal of the first transistor. The third transistor includes a gate terminal for receiving the first light emitting clock signal and a first terminal coupled to the first power source. The first capacitor includes one terminal coupled to the second terminal of the second transistor and another terminal coupled to a second terminal of the third transistor. The fourth transistor includes a gate terminal coupled to the one terminal of the first capacitor, a first terminal coupled to the other terminal of the first capacitor, and a second terminal for receiving the second light emitting clock signal. The fifth transistor includes a gate terminal for receiving the partial driving selection signal, a first terminal coupled to the other terminal of the first capacitor, and a second terminal coupled to the second power source. The sixth transistor includes a gate terminal for receiving the inverted area selection signal and a first terminal coupled to the first power source. The seventh transistor includes a gate terminal coupled to the other terminal of the first capacitor and a first terminal coupled to a second terminal of the sixth transistor. The eighth transistor includes a gate terminal for receiving the area selection signal, a first terminal coupled to a second terminal of the seventh transistor, and a second terminal coupled to the second power source. The ninth transistor includes a gate terminal for receiving the first light emitting clock signal, a first terminal coupled to the second terminal of the seventh transistor, and a second terminal coupled to the second power source. The tenth transistor includes a gate terminal coupled to the second terminal of the seventh transistor and a first terminal coupled to the first power source. The eleventh transistor includes a gate terminal coupled to the other terminal of the first capacitor and a first terminal coupled to a second terminal of the tenth transistor. The twelfth transistor includes a gate terminal for receiving the inverted area selection signal, a first terminal coupled to a second terminal of the eleventh transistor, and a second terminal coupled to the second power source. The thirteenth transistor includes a gate terminal coupled to the second terminal of the tenth transistor and a first terminal coupled to the first power source. The second capacitor includes one terminal coupled to the gate terminal of the tenth transistor and another terminal coupled to a second terminal of the thirteenth transistor. The fourteenth transistor includes a gate terminal coupled to the one terminal of the second capacitor, a first terminal coupled to the other terminal of the second capacitor, and a second terminal coupled to the second power source.

The second partial driver may include first through fourteenth transistors and first and second capacitors. The first transistor includes a gate terminal for receiving the second light emitting clock signal and a second terminal for receiving the fourth shift signal. The second transistor includes a gate terminal for receiving the partial driving selection signal, a first terminal coupled to a first power source, and a second terminal coupled to a first terminal of the first transistor. The third transistor includes a gate terminal for receiving the second light emitting clock signal and a first terminal coupled to the first power source. The first capacitor includes one terminal coupled to the second terminal of the second transistor and another terminal coupled to a second terminal of the third transistor. The fourth transistor includes a gate terminal coupled to the one terminal of the first capacitor, a first terminal coupled to the other terminal of the first capacitor, and a second terminal for receiving the first light emitting clock signal. The fifth transistor includes a gate terminal for receiving the partial driving selection signal, a first terminal coupled to the other terminal of the first capacitor, and a second terminal coupled to the second power source. The sixth transistor includes a gate terminal for receiving the inverted area selection signal and a first terminal coupled to the first power source. The seventh transistor includes a gate terminal coupled to the other terminal of the first capacitor and a first terminal coupled to a second terminal of the sixth transistor. The eighth transistor includes a gate terminal for receiving the area selection signal, a first terminal coupled to a second terminal of the seventh transistor, and a second terminal coupled to the second power source. The ninth transistor includes a gate terminal for receiving the second light emitting clock signal, a first terminal coupled to the second terminal of the seventh transistor, and a second terminal coupled to the second power source. The tenth transistor includes a gate terminal coupled to the second terminal of the seventh transistor and a first terminal coupled to the first power source. The eleventh transistor includes a gate terminal coupled to the other terminal of the first capacitor and a first terminal coupled to a second terminal of the tenth transistor. The twelfth transistor includes a gate terminal for receiving the inverted area selection signal, a first terminal coupled to a second terminal of the eleventh transistor, and a second terminal coupled to the second power source. The thirteenth transistor includes a gate terminal coupled to the second terminal of the tenth transistor and a first terminal coupled to the first power source. The second capacitor includes one terminal coupled to the gate terminal of the tenth transistor and another terminal coupled to a second terminal of the thirteenth transistor. The fourteenth transistor includes a gate terminal coupled to the one terminal of the second capacitor, a first terminal coupled to the other terminal of the second capacitor, and a second terminal coupled to the second power source.

According to another exemplary embodiment of the present invention, a driving method of a display device is provided. The display device includes a display unit. The display unit includes a plurality of scan lines, a plurality of data lines, a plurality of light emitting signal lines, and a plurality of pixels. The scan lines are for transmitting a plurality of scan signals. The data lines are for transmitting a plurality of data signals. The light emitting signal lines are for transmitting a plurality of light emitting signals. The pixels are coupled to the scan lines, the data lines, and the light emitting signal lines. The driving method includes receiving a partial driving selection signal, an area selection signal, a synchronization signal, and first and second light emitting clock signals. The partial driving selection signal is for selecting one of a normal driving mode or a partial driving mode. The area selection signal is for dividing the display unit into a display area and a non-display area. The synchronization signal is generated in synchronization with a vertical synchronization signal. The second light emitting clock signal is the inversion of the first light emitting clock signal. The driving method includes transmitting first light emitting signals of the light emitting signals at an on voltage level to a plurality of first light emitting signal lines and a plurality of second light emitting signal lines among the light emitting signal lines under the normal driving mode. The first light emitting signal lines correspond to the non-display area. The second light emitting signal lines correspond to the display area. The driving method includes transmitting second light emitting signals of the light emitting signals at an off voltage level to the first light emitting signal lines under the partial driving mode. The driving method includes transmitting third light emitting signals of the light emitting signals at the on voltage level to the second light emitting signal lines.

The transmitting of the first light emitting signals at the on voltage level may include receiving the second light emitting clock signal in accordance with the synchronization signal when the partial driving selection signal indicates the normal driving mode, and transmitting a first shift signal and a first light emitting signal of the first light emitting signals by inverting the first shift signal according to the second light emitting clock signal. The transmitting of the first light emitting signals at the on voltage level may include receiving the first light emitting clock signal in accordance with the first shift signal when the partial driving selection signal indicates the normal driving mode, and transmitting a second shift signal and a second light emitting signal of the first light emitting signals by inverting the second shift signal according to the first light emitting clock signal.

The transmitting of the second light emitting signals at the off voltage level may include maintaining the synchronization signal and the first and second light emitting clock signals at a voltage level when the partial driving selection signal indicates the partial driving mode.

According to yet another embodiment of the present invention, a display device is provided. The display device includes a display unit and a light emission driver. The display unit includes a plurality of scan lines, a plurality of data lines, a plurality of light emitting signal lines, and a plurality of pixels. The scan lines are for transmitting a plurality of scan signals. The data lines are for transmitting a plurality of data signals. The light emitting signal lines are for transmitting a plurality of light emitting signals. The pixels are coupled to the scan lines, the data lines, and the light emitting signal lines. The light emission driver is for receiving an area selection signal and an inverted area selection signal in which the area selection signal is inverted. The area selection signal is for dividing the display unit into a display area and a non-display area. The light emission driver is for generating first and second light emitting signals among the plurality of light emitting signals according to at least two scan signals of the plurality of scan signals. The light emission driver is for generating the first light emitting signal corresponding to the display area at an on voltage level. The light emission driver is for generating the second light emitting signal corresponding to the non-display area at an off voltage level.

The light emission driver may include a plurality of light emitting signal generators. The light emitting signal generators are respectively coupled to the light emitting signal lines. The light emitting signal generators are for generating the second light emitting signal of the off voltage level according to the inverted area selection signal and a corresponding first scan signal of the at least two scan signals. The light emitting signal generators are for generating the first light emitting signal of the on voltage level according to the area selection signal and a corresponding second scan signal of the at least two scan signals. The second scan signal is generated following the first scan signal.

Each of the light emitting signal generators may include first through ninth transistors and first and second capacitors. The first transistor includes a gate terminal for receiving the first scan signal and a first terminal coupled to a first power source. The second transistor includes a gate terminal for receiving the second scan signal and a first terminal coupled to a second terminal of the first transistor. The third transistor includes a gate terminal for receiving the area selection signal, a first terminal coupled to a second terminal of the second transistor, and a second terminal coupled to a second power source. The fourth transistor includes a gate terminal for receiving the inverted area selection signal, a first terminal coupled to the first power source, and a second terminal coupled to the second terminal of the first transistor. The fifth transistor includes a gate terminal coupled to the second terminal of the fourth transistor and a first terminal coupled to the first power source. The first capacitor includes one terminal coupled to the first power source and another terminal coupled to a second terminal of the fifth transistor. The sixth transistor includes a gate terminal for receiving the first scan signal, a first terminal coupled to the second terminal of the fifth transistor, and a second terminal coupled to the second power source. The seventh transistor includes a gate terminal for receiving the inverted area selection signal, a first terminal coupled to the other terminal of the first capacitor, and a second terminal coupled to the second power source. The eighth transistor includes a gate terminal coupled to the other terminal of the first capacitor and a first terminal coupled to the first power source. The ninth transistor includes a gate terminal coupled to the gate terminal of the fifth transistor, a first terminal coupled to a second terminal of the eighth transistor, and a second terminal coupled to the second power source. The second capacitor includes one terminal coupled to the gate terminal of the ninth transistor and another terminal coupled to the first terminal of the ninth transistor.

The display device may further include a scan driver. The scan driver is for receiving a synchronization signal, first and second light emitting clock signals, and first and second initialization signals. The synchronization signal is in synchronization with a vertical synchronization signal. The second light emitting clock signal is the first light emitting clock signal that is shifted by half a cycle. The first initialization signal has a phase delay from the second light emitting clock signal. The second initialization signal has the phase delay from the first light emitting clock signal. The scan driver is for sequentially generating the scan signals.

The scan driver may include a plurality of first scan signal generators and a plurality of second scan signal generators. The first scan signal generators are for outputting one of the second light emitting clock signal or a first power source voltage as a plurality of first scan signals according to the first initialization signal and a first input signal input in synchronization with the first light emitting clock signal. The second scan signal generators are for outputting one of the first light emitting clock signal or the first power source voltage as a plurality of second scan signals according to the second initialization signal and a second input signal input in synchronization with the second light emitting clock signal.

For each first scan signal generator of the plurality of first scan signal generators, the first input signal may be the synchronization signal or one of the second scan signals output from one of the second scan signal generators that is earlier than and adjacent to the first scan signal generator.

For each second scan signal generator of the plurality of second scan signal generators, the second input signal may be one of the first scan signals output from one of the first scan signal generators that is earlier than and adjacent to the second scan signal generator.

The display device may further include a data driver. The data driver is for transmitting valid data of the plurality of data signals to the data lines when driving the display area. The data driver is for transmitting invalid data of the plurality of data signals to the data lines when driving the non-display area.

The data driver may be configured to transmit the valid data to the data lines during a period in which the area selection signal corresponding to the display area is applied. The data driver may be configured to transmit the invalid data to the data lines during a period in which the area selection signal corresponding to the non-display area is applied.

According to still yet another exemplary embodiment of the present invention, a driving method of a display device is provided. The display device includes a display unit. The display unit includes a plurality of scan lines, a plurality of data lines, a plurality of light emitting signal lines, and a plurality of pixels. The scan lines are for transmitting a plurality of scan signals. The data lines are for transmitting a plurality of data signals. The light emitting signal lines are for transmitting a plurality of light emitting signals. The pixels are coupled to the scan lines, the data lines, and the light emitting signal lines. The driving method includes receiving an area selection signal, an inverted area selection signal in which the area selection signal is inverted, and at least two scan signals among the plurality of scan signals. The area selection signal is for dividing the display unit into a display area and a non-display area. The driving method includes generating a first one of the light emitting signals at an on voltage level corresponding to the display area according to the inverted area selection signal and a first scan signal of the at least two scan signals. The driving method includes generating a second one of the light emitting signals at an off voltage level corresponding to the non-display area according to the area selection signal and a second scan signal of the at least two scan signals.

The driving method may further include receiving a synchronization signal, first and second light emitting clock signals, and first and second initialization signals for sequentially generating the scan signals. The synchronization signal is generated in synchronization with a vertical synchronization signal. The second light emitting clock signal is the first light emitting clock signal that is shifted by half a cycle. The first initialization signal has a phase delay from the second light emitting clock signal. The second initialization signal has the phase delay from the first light emitting clock signal.

The sequentially generating the scan signals may include outputting one of the second light emitting clock signal and a first power source voltage as a plurality of first scan signals of the plurality of scan signals according to the first initialization signal and a first input signal input in synchronization with the first light emitting clock signal. The sequentially generating the scan signals may include outputting one of the first light emitting clock signal and the first power source voltage as a plurality of second scan signals of the plurality of scan signals according to the second initialization signal and a second input signal input in synchronization with the second light emitting clock signal.

The driving method may further include transmitting valid data of the plurality of data signals to the data lines during a period in which the area selection signal corresponding to the display area is applied. The driving method may further include transmitting invalid data of the plurality of data signals to the data lines during a period in which the area selection signal corresponding to the non-display area is applied.

As described above, according to display device embodiments of the present invention, power consumption may be reduced, and the driver for the display device only includes PMOS transistors such that the production process may be simplified.

BRIEF DESCRIPTION OF THE DRAWINGS

The accompanying drawings, together with the specification, illustrate exemplary embodiments of the present invention, and, together with the description, serve to explain the principles of embodiments of the present invention.

DETAILED DESCRIPTION

Figure 1:
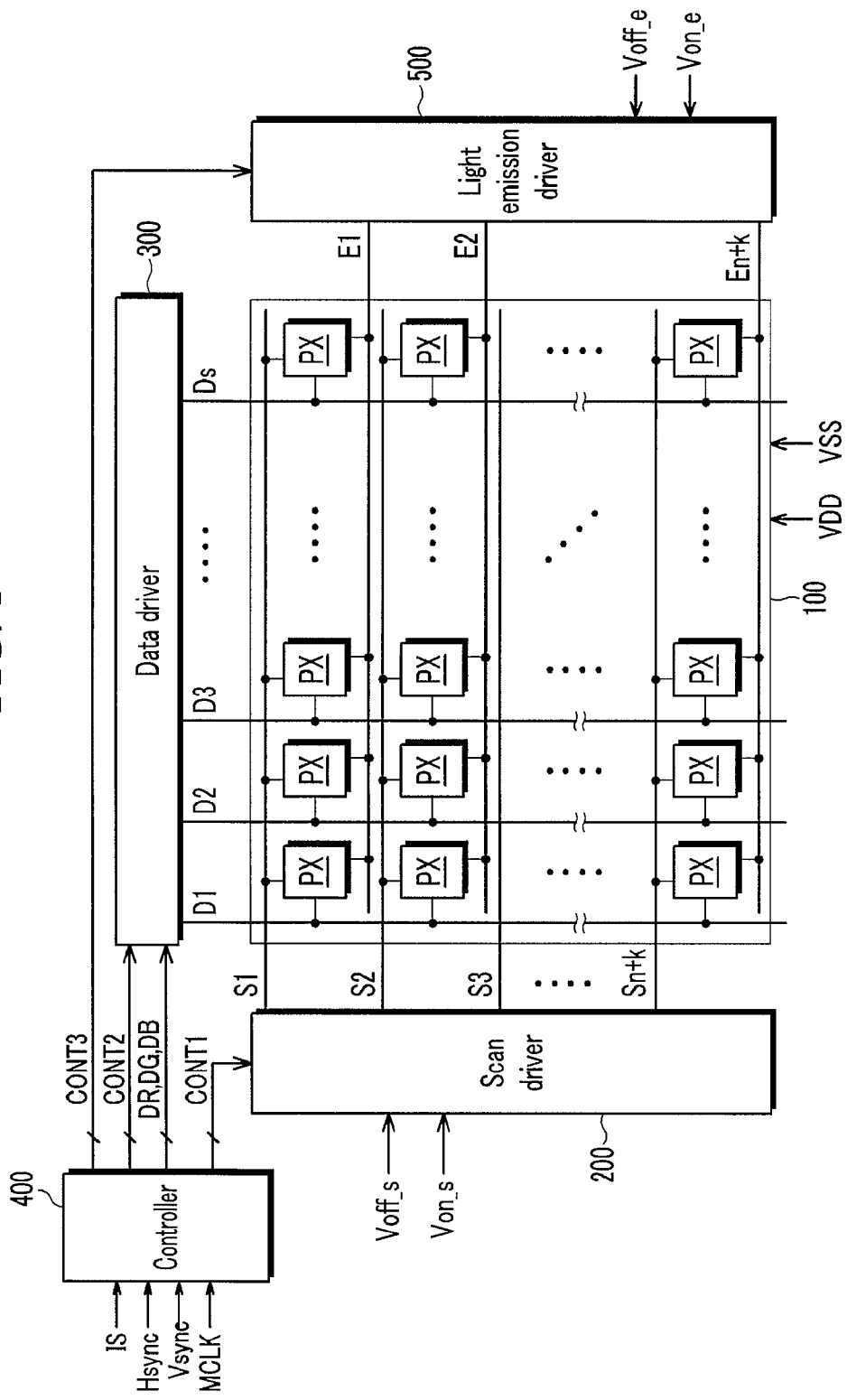
FIG. 1 is a block diagram illustrating a display device according to an exemplary embodiment of the present invention.

In the following detailed description, only certain exemplary embodiments of the present invention have been shown and described, simply by way of illustration. As those skilled in the art would realize, the described embodiments may be modified in various ways, all without departing from the spirit or scope of the present invention. Accordingly, the drawings and description are to be regarded as illustrative in nature and not restrictive. Like reference numerals designate like elements throughout the specification. In addition, power sources and their corresponding voltages may be referred to using the same reference name, with the appropriate meaning apparent from context.

Throughout this specification and the claims that follow, when it is described that an element is "coupled" to another element, the element may be "directly coupled" (e.g., connected) to the other element or "electrically coupled" (e.g., electrically connected) to the other element through one or more third elements. In addition, unless explicitly described to the contrary, the word "comprise" and variations such as "comprises" or "comprising" will be understood to imply the inclusion of stated elements but not the exclusion of any other elements.

Figure 2:
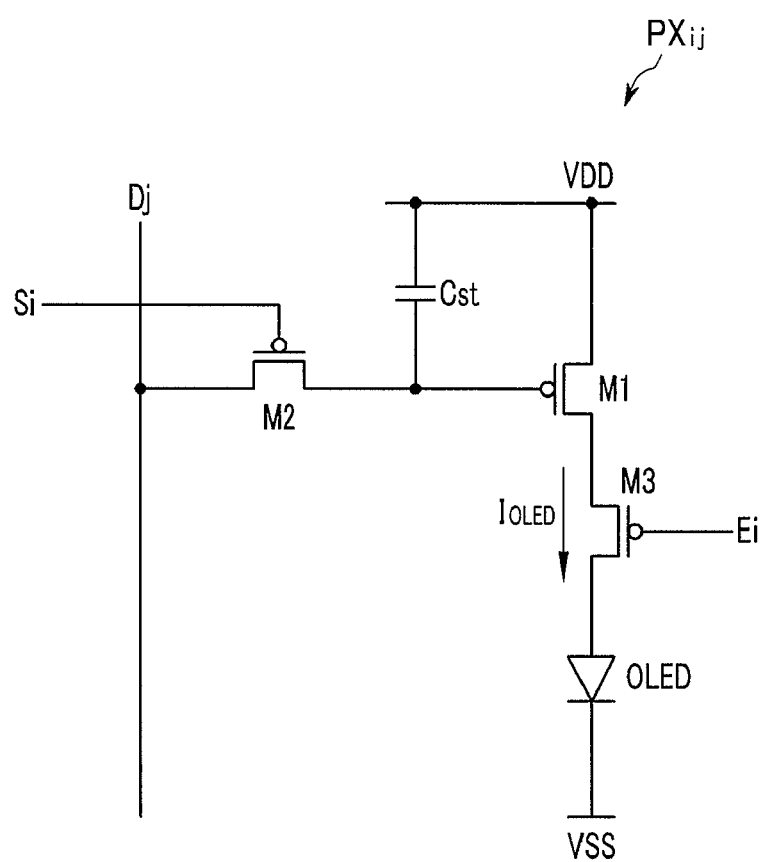
FIG. 2 is an equivalent circuit diagram of a pixel PX shown in FIG. 1.
Figure 3:
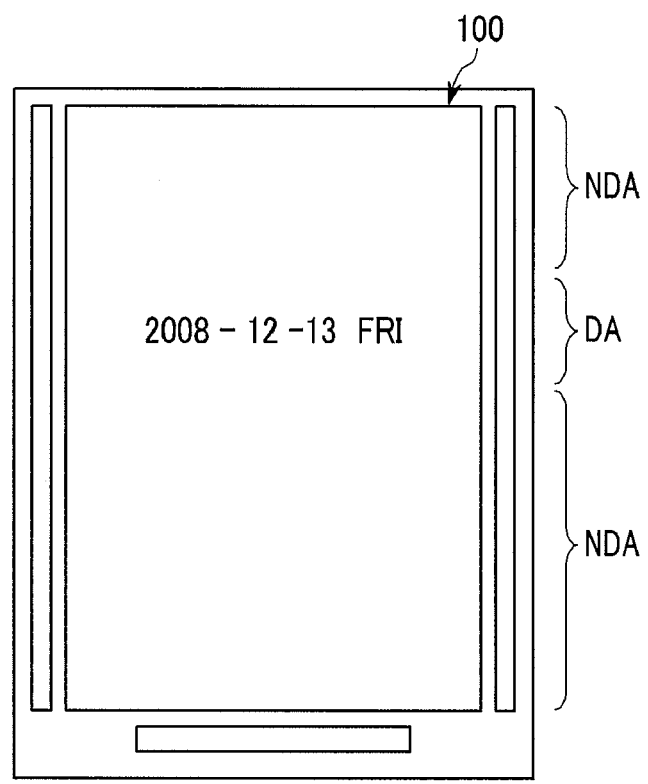
FIG. 3 is a conceptual view of an image represented in the display unit 100 shown in FIG. 1.

FIG. 1 is a block diagram illustrating a display device according to an exemplary embodiment of the present invention. FIG. 2 is an equivalent circuit diagram of a pixel PX shown in FIG. 1. FIG. 3 is a conceptual view of an image represented in the display unit 100 shown in FIG. 1.

Referring to FIG. 1, a display device includes a display unit 100, a scan driver 200, a data driver 300, a controller 400, and a light emission driver 500. The display unit 100 includes a plurality of signal lines S1-Sn+k, D1-Ds, and E1-En+k, and a plurality of pixels PX coupled thereto and arranged substantially in a matrix. The signal lines S1-Sn+k, D1-Ds, and E1-En+k include a plurality of scan lines S1-Sn+k for transmitting scan signals, a plurality of data lines D1-Ds for transmitting data voltages, and a plurality of light emitting signal lines E1-En+k for transmitting light emitting signals. The scan lines S1-Sn+k and the light emitting signal lines E1-En+k are arranged in the row direction and are substantially parallel to each other, and the data lines D1-Ds are arranged in the column direction and are substantially parallel to each other.

At a given point in time, the display unit 100 includes a display area DA for displaying images and a non-display area NDA that is not currently displaying any images, as shown in FIG. 3. The display unit 100 of FIG. 3 illustrates a conceptual standby screen of a mobile phone. In an exemplary embodiment of the present invention, in a standby screen, an area in which an icon such as a clock, etc., is displayed is defined as the display area DA. The remaining area except for the display area DA is defined as the non-display area NDA.

Referring to FIG. 2, each pixel PX, for example, a pixel PXij that is coupled to an i-th (i=1, 2, ..., n) scan line Si and light emitting signal line Ei, and a j-th (j=1, 2, ..., m) data line Dj, includes an organic light emitting diode (OLED), a driving transistor M1, a storage capacitor Cst, a switching transistor M2, and a light emission control transistor M3.

The driving transistor M1 includes a source terminal coupled to a first power source VDD and a drain terminal coupled to a source terminal of the light emission control transistor M3. A gate terminal of the driving transistor M1 is coupled to a drain terminal of the switching transistor M2.

The switching transistor M2 includes a gate terminal coupled to the i-th scan line Si and a source terminal coupled to the j-th data line Dj. The switching transistor M2 performs a switching operation in response to a scan signal that is applied to the i-th scan line Si. When the switching transistor M2 is turned on, a data voltage, i.e., a data signal that is applied to the j-th data line Dj, is transferred to the gate terminal of the driving transistor M1.

The storage capacitor Cst is coupled between the source terminal and the gate terminal of the driving transistor M1. The storage capacitor Cst charges a data voltage that is applied to the gate terminal of the driving transistor M1, and even after the switching transistor M2 is turned off, the storage capacitor Cst maintains the data voltage charge.

The light emission control transistor M3 includes a gate terminal coupled to the i-th light emitting signal line Ei and a drain terminal coupled to an anode of the OLED. The light emission control transistor M3 receives the i-th light emitting signal EMi through the i-th light emitting signal line Ei such that it is selectively turned on, and thereby a current IOLED that flows through the driving transistor M1 is supplied to the OLED.

The OLED is coupled to a second power source VSS through a cathode. The OLED displays an image by emitting light with different intensities according to the current IOLED that is supplied by the driving transistor M1 through the light emission control transistor M3.

Referring back to FIG. 1, the scan driver 200 is coupled to the scan lines S1 to Sn+k of the display unit 100, and sequentially applies the scan signals to the scan lines S1-Sn+k in accordance with a scan control signal CONT1. Each scan signal is either a scan-on voltage Von (also denoted Von_s) that can turn on the switching transistor M2 or a scan-off voltage Voff (also denoted Voff_s) that can turn off the switching transistor M2. In a case when the switching transistor M2 is a p-channel field effect transistor, the gate-on voltage Von and the gate-off voltage Voff are a low voltage and a high voltage, respectively.

The data driver 300 is coupled to the data lines D1 to Ds of the display unit 100. The data driver 300 converts image data DR, DG, and DB into data voltages and applies them to the data lines D1 to Ds in accordance with a data control signal CONT2.

The controller 400 receives input signals R, G, and B (also collectively denoted IS), a horizontal synchronization signal Hsync, a vertical synchronization signal Vsync, and a main clock signal MCLK from the outside to generate the image data DR, DG, and DB, the scan control signal CONT1, the data control signal CONT2, and a light emission control signal CONT3.

The scan control signal CONT1 includes a scan start signal STV for indicating starting of scanning, and at least one clock signal for controlling an output period of the scan-on voltage Von_s. The scan control signal CONT1 may further include an output enable signal OE for limiting the duration of the scan-on voltage Von_s. The data control signal CONT2 includes a horizontal synchronization start signal STH for indicating starting of a transmission of the image data signals DR, DG, and DB for one row of pixels PX to the data driver 300, and a load signal LOAD for indicating application of data voltages to the data lines D1-Ds.

The light emission control signal CONT3 according to an exemplary embodiment of FIG. 1 includes a synchronization signal FLM, a first light emitting clock signal CLK1, a second light emitting clock signal CLK2, a partial driving selection signal ESR, an area selection signal PTA, and an inverted area selection signal PTB. The synchronization signal FLM is generated concurrently (for example, in synchronization) with the vertical synchronization signal Vsync, and indicates a starting point of a frame. Here, the vertical synchronization signal Vsync has a period in which an image of a frame is displayed as a cycle, and includes a low-level pulse that instructs the start of a frame as a cycle unit.

The synchronization signal FLM includes a low-level pulse that is generated concurrently (for example, synchronized) with a low-level pulse of the first light emitting clock signal CLK1. The synchronization signal FLM is first generated after a time point at which a low-level pulse of the vertical synchronization signal Vsync is generated under a normal driving mode. The synchronization signal FLM is maintained at a high voltage level under a partial driving mode. The first light emitting clock signal CLK1 includes a plurality of low-level pulses that are generated according to a cycle (for example, a predetermined cycle), and is maintained at the high voltage level under the partial driving mode. The second light emitting clock signal CLK2 has a phase difference of 180 degrees with the first light emitting clock signal CLK1 under the normal driving mode, and is maintained at the high voltage level under the partial driving mode.

The partial driving selection signal ESR has different levels according to the driving mode. The partial driving selection signal ESR is maintained at the high voltage level under the normal driving mode and is maintained at the low voltage level under the partial driving mode. The area selection signal PTA includes information related to the display area DA. The light emission driver 500 transmits the light emitting signal to the light emitting signal lines corresponding to the display area DA among the plurality of light emitting signal lines E1-En+k according to the area selection signal PTA. The inverted area selection signal PTB is an inverted signal of the area selection signal PTA.

In an exemplary embodiment of the present invention, the plurality of light emitting signal lines corresponding to the display area DA among the plurality of light emitting signal lines E1-En+k are set up from the (n+1)-th light emitting signal line En+1 to the m-th light emitting signal line Em. In this particular embodiment, the area selection signal PTA is at the low voltage level under the partial driving mode in only a partial section of a frame. However, the present invention is not limited thereto. For example, in another embodiment, the area selection signal PTA may always be the low voltage level under the partial driving mode.

The light emission driver 500 is coupled to the light emitting signal lines E1-En+k of the display unit 100, and sequentially applies a plurality of light emitting signals EM1-EMn+k to the light emitting signal lines E1-En+k according to the light emission control signal CONT3. The light emission driver 500 according to the above exemplary embodiment of the present invention supplies the plurality of light emitting signals EMn+1-EMm at a light emitting on voltage Von_e level to a plurality of light emitting signal lines EMn+1-EMm corresponding to the display area DA among the plurality of light emitting signal lines E1-En+k, and supplies the plurality of light emitting signals EM1-EMn and EMm+1-EMn+k at a light emitting off voltage Voff_e level to the plurality of light emitting signal lines E1-En and Em+1-En+k corresponding to the non-display area NDA.

Here, the light emitting on voltage Von_e is a voltage capable of turning on the light emission control transistor M3, and the light emitting off voltage Voff_e is a voltage capable of turning off the light emission control transistor M3. Therefore, a pixel PX corresponding to the display area DA emits light and a pixel PX corresponding to the non-display area NDA does not emit light. The light emission driver 500 uses P-MOS transistors in an exemplary embodiment of FIG. 1, and a detailed configuration thereof will be described with reference to FIG. 4.

Figure 4:
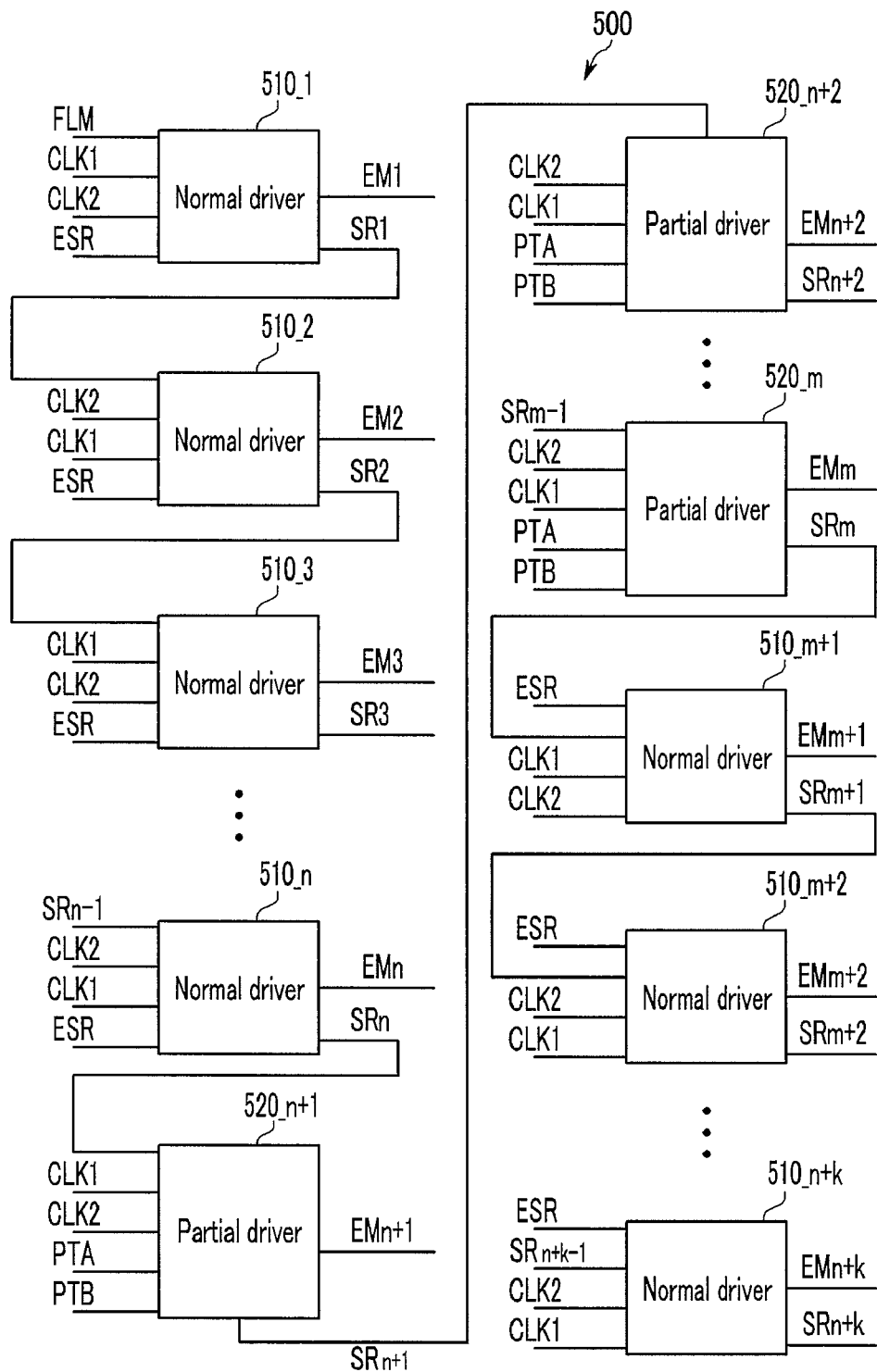
FIG. 4 is a block diagram of the light emission driver 500 shown in FIG. 1.

FIG. 4 is a block diagram of the light emission driver 500 shown in FIG. 1.

Referring to FIG. 4, the light emission driver 500 includes a plurality of normal drivers 510_1-510_n and 510_m+1-510_n+k and a plurality of partial drivers 520_n+1-520_m. The plurality of normal drivers 510_1-510_n and 510_m+1-510_n+k are respectively coupled to the plurality of light emitting signal lines E1-En and Em+1-En+k corresponding to the non-display area NDA among the plurality of light emitting signal lines E1-En+k. The plurality of partial drivers 520_n+1-520_m are respectively coupled to the light emitting signal lines En+1-Em corresponding to the display area DA among the plurality of light emitting signal lines E1-En+k.

The plurality of normal drivers 510_1-510_n and 510_m+1-510_n+k include a plurality of normal drivers 510_x (x is an odd number from 1 to n and m+1 to n+k) (hereinafter referred to as first normal drivers) for generating odd-numbered light emitting signals and a plurality of normal drivers 510_y (y is an even number from 1 to n and m+1 to n+k) (hereinafter referred to as the second normal driver) for generating even-numbered light emitting signals among the plurality of light emitting signals EM1-EMn and EMm+1-EMn+k.

Each of the plurality of first normal drivers 510_x receives a shift signal output from the corresponding second normal driver 510_x−1 that is earlier than and adjacent to the first normal driver under the normal driving mode. Each of the plurality of first normal drivers 510_x receives the second light emitting clock signal CLK2 in accordance with the shift signal transmitted from the adjacent second normal driver 510_x−1, and generates the shift signal and the light emitting signal EMx by inverting the shift signal according to the second light emitting clock signal CLK2. When a partial driver is earlier than and adjacent with respect to one of the plurality of first normal drivers 510_x, that first normal driver receives the second light emitting clock signal CLK2 in accordance with the shift signal transmitted from the partial driver, and generates the shift signal and the light emitting signal (e.g., by inverting the shift signal) according to the second light emitting clock signal CLK2.

The initial first normal driver 510_1 among the plurality of first normal drivers 510_x receives the partial driving selection signal ESR, the first light emitting clock signal CLK1, and the synchronization signal FLM, and receives the second light emitting clock signal CLK2 in accordance with the synchronization signal FLM. The first normal driver 510_1 generates the first shift signal SR1 and the first light emitting signal EM1 (e.g., by inverting the first shift signal SR1) according to the input second light emitting clock signal CLK2. The first shift signal SR1 output from the initial first normal driver 510_1 is transmitted to the adjacent initial second normal driver 510_2, and the first light emitting signal EM1 is transmitted to the first light emitting signal line E1. In addition, each of the plurality of first normal drivers 510_x outputs the second power source voltage VSS as the shift signal according to the partial driving selection signal ESR under the partial driving mode, and outputs the first power source voltage VDD as the light emitting signal EMx.

Each of the plurality of second normal drivers 510_y receives the shift signal output from the corresponding first normal driver 510_y−1 that is earlier than (in front of) and adjacent to the second normal driver under the normal driving mode. Each of the plurality of second normal drivers 510_y receives the first light emitting clock signal CLK1 in accordance with the shift signal transmitted from the adjacent first normal driver 510_y−1, and generates the shift signal and the light emitting signal EMy by inverting the shift signal according to the first light emitting clock signal CLK1. When a partial driver is earlier than (in front of) and adjacent with respect to one of the plurality of second normal drivers 510_y, that second normal driver receives the first light emitting clock signal CLK1 in accordance with the shift signal transmitted from the partial driver, and generates the shift signal and the light emitting signal EMy (e.g., by inverting the shift signal) according to the first light emitting clock signal CLK1. In addition, each of the plurality of second normal drivers 510_y outputs the second power source voltage VSS as the shift signal according to the partial driving selection signal ESR under the partial driving mode, and outputs the first power source voltage VDD as the light emitting signal EMy.

In an exemplary embodiment of the present invention shown in FIG. 4, the partial driver 520_m is positioned directly before the first normal driver 510_m+1. However, the present invention is not limited thereto. Accordingly, when a partial driver is earlier than (in front of) and adjacent with respect to one of the plurality of second normal drivers 510_y, that second normal driver receives the first light emitting clock signal CLK1 in accordance with the shift signal transmitted from the partial driver, and generates the shift signal and the light emitting signal (e.g., by inverting the shift signal) according to the first light emitting clock signal CLK1.

The plurality of partial drivers 520_n+1-520_m include a plurality of partial drivers 520_x (x is an odd number from n+1 to m) (hereinafter referred to as first partial drivers) for generating odd-numbered light emitting signals and a plurality of partial drivers 520_y (y is an odd number from n+1 to m) (hereinafter referred to as second partial drivers) for generating even-numbered light emitting signals among the plurality of light emitting signals EMn+1-EMm.

Each of the plurality of first partial drivers 520_x receives a shift signal output from the second partial driver 520_x−1 that is earlier than (in front of) and adjacent to the first partial driver 520_x under the normal driving mode. Each of the plurality of first partial drivers 520_x receives the second light emitting clock signal CLK2 in accordance with the shift signal transmitted from the adjacent second partial driver 520_x−1, and generates the shift signal and the light emitting signal EMx by inverting the shift signal according to the second light emitting clock signal CLK2. When a normal driver is earlier than (in front of) and adjacent with respect to one of the plurality of first partial drivers 520_x, that first partial driver receives the second light emitting clock signal CLK2 in accordance with the shift signal transmitted from the normal driver, and generates the shift signal and the light emitting signal EMx (e.g., by inverting the shift signal) according to the second light emitting clock signal CLK2.

Each of the plurality of first partial drivers 520_x outputs the first power source voltage VDD as the shift signal according to the partial driving selection signal ESR, the area selection signal PTA, and the inverted area selection signal PTB, and outputs the second power source voltage VSS as the light emitting signal EMx under the partial driving mode.

Each of the plurality of second partial drivers 520_y receives the shift signal output from the corresponding first partial driver 520_y−1 that is earlier than (in front of) and adjacent to the second partial driver 520_y under the normal driving mode. Each of the plurality of second partial drivers 520_y receives the first light emitting clock signal CLK1 in accordance with the shift signal transmitted from the adjacent first partial driver 520_y−1, and generates the shift signal and the light emitting signal EMy by inverting the shift signal according to the first light emitting clock signal CLK1. Each of the plurality of second partial drivers 520_y outputs the first power source voltage VDD as the shift signal according to the partial driving selection signal ESR, the area selection signal PTA, and the inverted area selection signal PTB, and outputs the second power source voltage VSS as the light emitting signal EMy under the partial driving mode.

Figure 5:
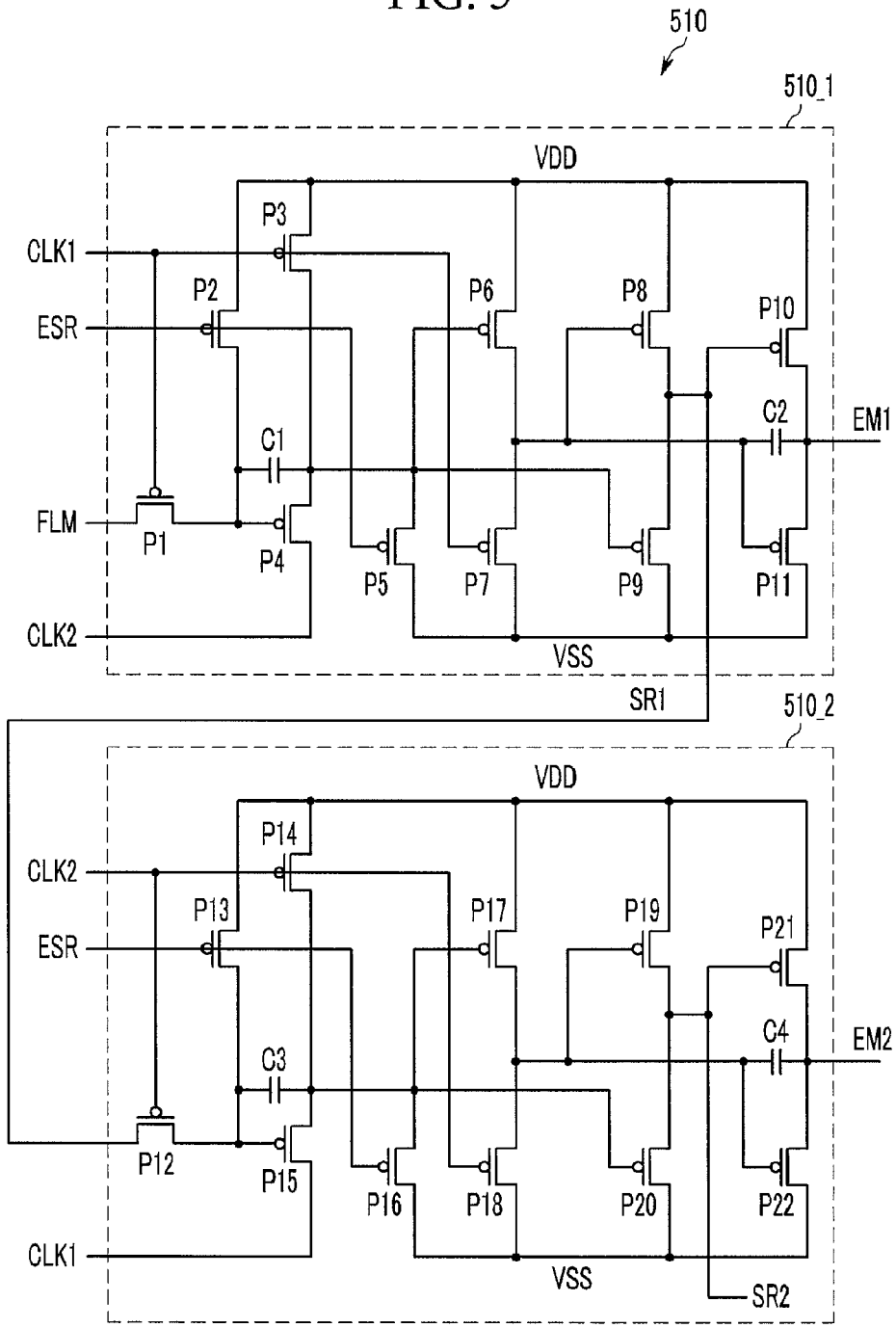
FIG. 5 is a detailed circuit diagram of the normal driver shown in FIG. 4.

FIG. 5 is a detailed circuit diagram of the normal driver shown in FIG. 4. FIG. 5 only shows a two-driver circuit 510 that includes the initial first and second normal drivers 510_1 and 510_2 for better understanding and ease of description. However, the circuit configuration of the remaining first and second normal drivers 510_x and 510_y is substantially the same in one embodiment.

Referring to FIG. 5, the first normal driver 510_1 includes first through eleventh transistors P1-P11 and first and second capacitors C1 and C2. The first transistor P1 includes a gate terminal for receiving the first light emitting clock signal CLK1 and a drain terminal for receiving the synchronization signal FLM. The second transistor P2 includes a gate terminal for receiving the partial driving selection signal ESR, a source terminal coupled to the first power source VDD, and a drain terminal coupled to a source terminal of the first transistor P1. The third transistor P3 includes a gate terminal for receiving the first light emitting clock signal CLK1 and a source terminal coupled to the first power source VDD.

The fourth transistor P4 includes a gate terminal coupled to the drain terminal of the second transistor P2, a source terminal coupled to a drain terminal of the third transistor P3, and a drain terminal for receiving the second light emitting clock signal CLK2. The fifth transistor P5 includes a gate terminal for receiving the partial driving selection signal ESR, a source terminal coupled to the source terminal of the fourth transistor P4, and a drain terminal coupled to the second power source VSS.

The sixth transistor P6 includes a gate terminal coupled to the source terminal of the fifth transistor P5 and a source terminal coupled to the first power source VDD. The seventh transistor P7 includes a gate terminal for receiving the first light emitting clock signal CLK1, a source terminal coupled to a drain terminal of the sixth transistor P6, and a drain terminal coupled to the second power source VSS.

The eighth transistor P8 includes a gate terminal coupled to the drain terminal of the sixth transistor P6 and a source terminal coupled to the first power source VDD. The ninth transistor P9 includes a gate terminal coupled to the gate terminal of the sixth transistor P6, a source terminal coupled to a drain terminal of the eighth transistor P8, and a drain terminal coupled to the second power source VSS. The node of the drain terminal of the eighth transistor P8 and the source terminal of the ninth transistor P9 becomes an output terminal of the first shift signal SR1. The tenth transistor P10 includes a gate terminal coupled to the drain terminal of the eighth transistor P8 and a source terminal coupled to the first power source VDD.

The eleventh transistor P11 includes a gate terminal coupled to the gate terminal of the eighth transistor P8, a source terminal coupled to a drain terminal of the tenth transistor P10, and a drain terminal coupled to the second power source VSS. The node of the drain terminal of the tenth transistor P10 and the source terminal of the eleventh transistor P11 becomes an output terminal of the first light emitting signal EM1. The first capacitor C1 includes one terminal coupled to the gate terminal of the fourth transistor P4 and another terminal coupled to the source terminal of the fourth transistor P4. The second capacitor C2 includes one terminal coupled to the gate terminal of the eleventh transistor P11 and another terminal coupled to the source terminal of the eleventh transistor P11.

The second normal driver 510_2 includes first through eleventh transistors P12-P22 and first and second capacitors C3 and C4. The first transistor P12 includes a gate terminal for receiving the second light emitting clock signal CLK2 and a drain terminal for receiving the first shift signal SR1. The second transistor P13 includes a gate terminal for receiving the partial driving selection signal ESR, a source terminal coupled to the first power source VDD, and a drain terminal coupled to a source terminal of the first transistor P12. The third transistor P14 includes a gate terminal for receiving the second light emitting clock signal CLK2 and a source terminal coupled to the first power source VDD.

The fourth transistor P15 includes a gate terminal coupled to the drain terminal of the second transistor P13, a source terminal coupled to a drain terminal of the third transistor P14, and a drain terminal for receiving the first light emitting clock signal CLK1. The fifth transistor P16 includes a gate terminal for receiving the partial driving selection signal ESR, a source terminal coupled to the source terminal of the fourth transistor P15, and a drain terminal coupled to the second power source VSS.

The sixth transistor P17 includes a gate terminal coupled to the source terminal of the fifth transistor P16 and a source terminal coupled to the first power source VDD. The seventh transistor P18 includes a gate terminal for receiving the second light emitting clock signal CLK2, a source terminal coupled to a drain terminal of the sixth transistor P17, and a drain terminal coupled to the second power source VSS.

The eighth transistor P19 includes a gate terminal coupled to the drain terminal of the sixth transistor P17 and a source terminal coupled to the first power source VDD. The ninth transistor P20 includes a gate terminal coupled to the gate terminal of the sixth transistor P17, a source terminal coupled to a drain terminal of the eighth transistor P19, and a drain terminal coupled to the second power source VSS. The node of the drain terminal of the eighth transistor P19 and the source terminal of the ninth transistor P20 becomes an output terminal of the second shift signal SR2. The tenth transistor P21 includes a gate terminal coupled to the drain terminal of the eighth transistor P19 and a source terminal coupled to the first power source VDD.

The eleventh transistor P22 includes a gate terminal coupled to the gate terminal of the eighth transistor P19, a source terminal coupled to a drain terminal of the tenth transistor P21, and a drain terminal coupled to the second power source VSS. The node of the drain terminal of the tenth transistor P21 and the source terminal of the eleventh transistor P22 becomes an output terminal of the second light emitting signal EM2. The first capacitor C3 includes one terminal coupled to the gate terminal of the fourth transistor P15 and another terminal coupled to the source terminal of the fourth transistor P15. The second capacitor C4 includes one terminal coupled to the gate terminal of the eleventh transistor P22 and another terminal coupled to the source terminal of the eleventh transistor P22.

Figure 6:
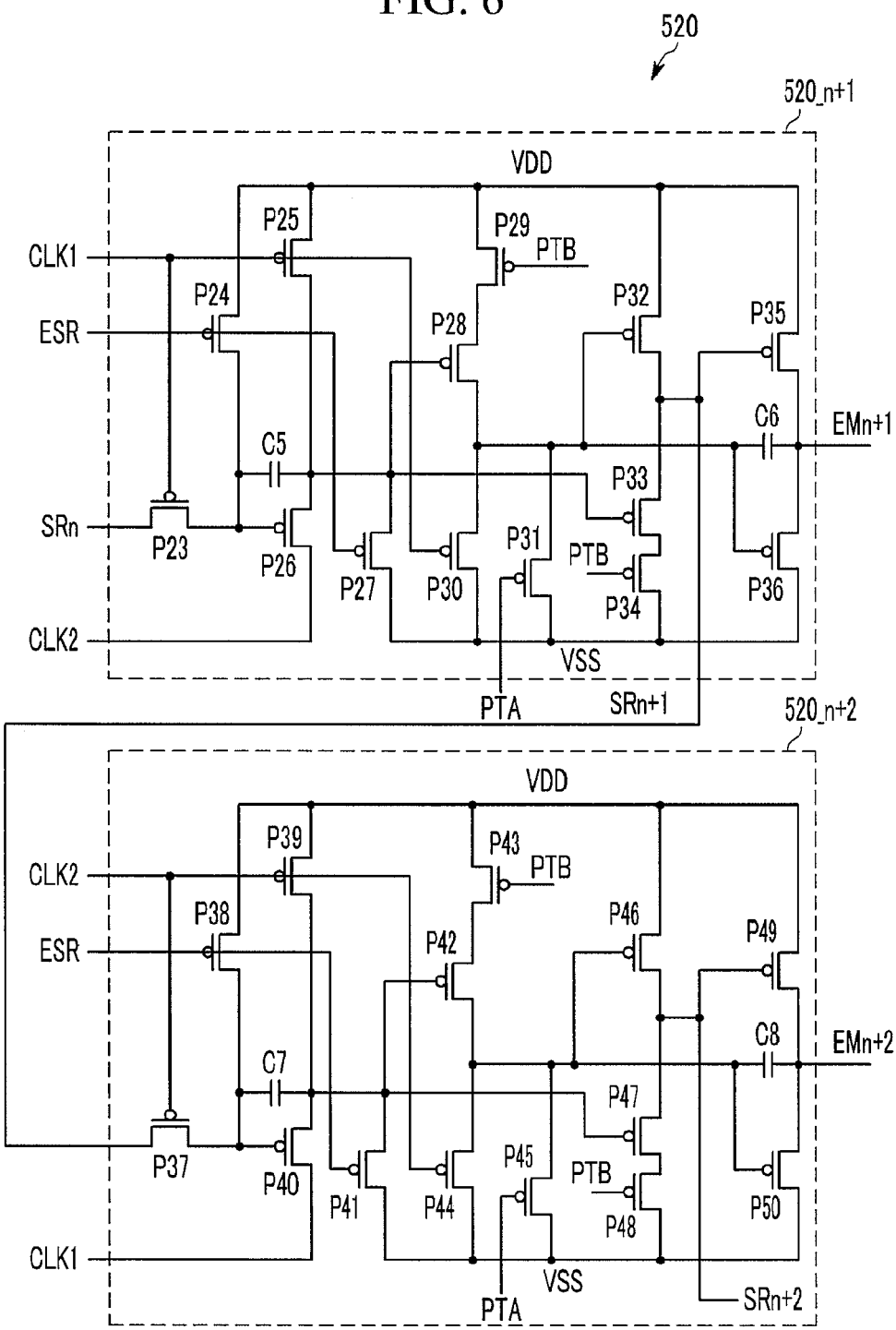
FIG. 6 is a detailed circuit diagram of the partial driver shown in FIG. 4.

FIG. 6 is a detailed circuit diagram of the partial driver shown in FIG. 4. FIG. 6 only shows a two-driver circuit 520 that includes the first and second partial drivers 520_n+1 and 520_n+2 for better understanding and ease of description. However, the circuit configuration of the remaining first and second partial drivers is substantially the same in one embodiment.

Referring to FIG. 6, the first partial driver 520_n+1 includes first through fourteenth transistors P23-P36 and first and second capacitors C5 and C6. The first transistor P23 includes a gate terminal for receiving the first light emitting clock signal CLK1 and a drain terminal for receiving the n-th shift signal SRn. The second transistor P24 includes a gate terminal for receiving the partial driving selection signal ESR, a source terminal coupled to the first power source VDD, and a drain terminal coupled to a source terminal of the first transistor P23. The third transistor P25 includes a gate terminal for receiving the first light emitting clock signal CLK1 and a source terminal coupled to the first power source VDD.

The fourth transistor P26 includes a gate terminal coupled to the drain terminal of the second transistor P24, a source terminal coupled to a drain terminal of the third transistor P25, and a drain terminal for receiving the second light emitting clock signal CLK2. The fifth transistor P27 includes a gate terminal for receiving the partial driving selection signal ESR, a source terminal coupled to the source terminal of the fourth transistor P26, and a drain terminal coupled to the second power source VSS.

The sixth transistor P28 includes a gate terminal coupled to the source terminal of the fifth transistor P27, a source terminal coupled to a drain terminal of the seventh transistor P29, and a drain terminal coupled to a source terminal of the eighth transistor P30. The seventh transistor P29 includes a gate terminal for receiving the inverted area selection signal PTB and a source terminal coupled to the first power source VDD. The eighth transistor P30 includes a gate terminal for receiving the first light emitting clock signal CLK1 and a drain terminal coupled to the second power source VSS. The ninth transistor P31 includes a gate terminal for receiving the area selection signal PTA, a source terminal coupled to the drain terminal of the sixth transistor P28, and a drain terminal coupled to the second power source VSS.

The tenth transistor P32 includes a gate terminal coupled to the source terminal of the ninth transistor P31 and a source terminal coupled to the first power source VDD. The eleventh transistor P33 includes a gate terminal coupled to the gate terminal of the sixth transistor P28, a source terminal coupled to a drain terminal of the tenth transistor P32, and a drain terminal coupled to a source terminal of the twelfth transistor P34. The twelfth transistor P34 includes a gate terminal for receiving the inverted area selection signal PTB and a drain terminal coupled to the second power source VSS. The node of the drain terminal of the tenth transistor P32 and the source terminal of the eleventh transistor P33 becomes an output terminal of the (n+1)-th shift signal SRn+1. The thirteenth transistor P35 includes a gate terminal coupled to the drain terminal of the tenth transistor P32 and a source terminal coupled to the first power source VDD.

The fourteenth transistor P36 includes a gate terminal coupled to the gate terminal of the tenth transistor P32, a source terminal coupled to a drain terminal of the thirteenth transistor P35, and a drain terminal coupled to the second power source VSS. The node of the drain terminal of the thirteenth transistor P35 and the source terminal of the fourteenth transistor P36 becomes an output terminal of the (n+1)-th light emitting signal EMn+1. The first capacitor C5 includes one terminal coupled to the drain terminal of the second transistor P24 and another terminal coupled to the drain terminal of the third transistor P25. The second capacitor C6 includes one terminal coupled to the gate terminal of the fourteenth transistor P36 and another terminal coupled to the source terminal of the fourteenth transistor P36.

The second partial driver 520_n+2 includes first through fourteenth transistors P37-P50 and first and second capacitors C7 and C8. The first transistor P37 includes a gate terminal for receiving the second light emitting clock signal CLK2 and a drain terminal for receiving the (n+1)-th shift signal SRn+1. The second transistor P38 includes a gate terminal for receiving the partial driving selection signal ESR, a source terminal coupled to the first power source VDD, and a drain terminal coupled to a source terminal of the first transistor P37. The third transistor P39 includes a gate terminal for receiving the second light emitting clock signal CLK2 and a source terminal coupled to the first power source VDD.

The fourth transistor P40 includes a gate terminal coupled to the drain terminal of the second transistor P38, a source terminal coupled to a drain terminal of the third transistor P39, and a drain terminal for receiving the first light emitting clock signal CLK1. The fifth transistor P41 includes a gate terminal for receiving the partial driving selection signal ESR, a source terminal coupled to the source terminal of the fourth transistor P40, and a drain terminal coupled to the second power source VSS.

The sixth transistor P42 includes a gate terminal coupled to the source terminal of the fifth transistor P41, a source terminal coupled to a drain terminal of the seventh transistor P43, and a drain terminal coupled to a source terminal of the eighth transistor P44. The seventh transistor P43 includes a gate terminal for receiving the inverted area selection signal PTB and a source terminal coupled to the first power source VDD. The eighth transistor P44 includes a gate terminal for receiving the second light emitting clock signal CLK2 and a drain terminal coupled to the second power source VSS. The ninth transistor P45 includes a gate terminal for receiving the area selection signal PTA, a source terminal coupled to the drain terminal of the sixth transistor P42, and a drain terminal coupled to the second power source VSS.

The tenth transistor P46 includes a gate terminal coupled to the source terminal of the ninth transistor P45 and a source terminal coupled to the first power source VDD. The eleventh transistor P47 includes a gate terminal coupled to the gate terminal of the sixth transistor P42, a source terminal coupled to a drain terminal of the tenth transistor P46, and a drain terminal coupled to a source terminal of the twelfth transistor P48. The twelfth transistor P48 includes a gate terminal for receiving the inverted area selection signal PTB and a drain terminal coupled to the second power source VSS. The node of the drain terminal of the tenth transistor P46 and the source terminal of the eleventh transistor P47 becomes an output terminal of the (n+2)-th shift signal SRn+2. The thirteenth transistor P49 includes a gate terminal coupled to the drain terminal of the tenth transistor P46 and a source terminal coupled to the first power source VDD.

The fourteenth transistor P50 includes a gate terminal coupled to the gate terminal of the tenth transistor P46, a source terminal coupled to a drain terminal of the thirteenth transistor P49, and a drain terminal coupled to the second power source VSS. The node of the drain terminal of the thirteenth transistor P49 and the source terminal of the fourteenth transistor P50 becomes an output terminal of the (n+2)-th light emitting signal EMn+2. The first capacitor C7 includes one terminal coupled to the drain terminal of the second transistor P38 and another terminal coupled to the drain terminal of the third transistor P39. The second capacitor C8 includes one terminal coupled to the gate terminal of the fourteenth transistor P50 and another terminal coupled to the source terminal of the fourteenth transistor P50.

Figure 7:
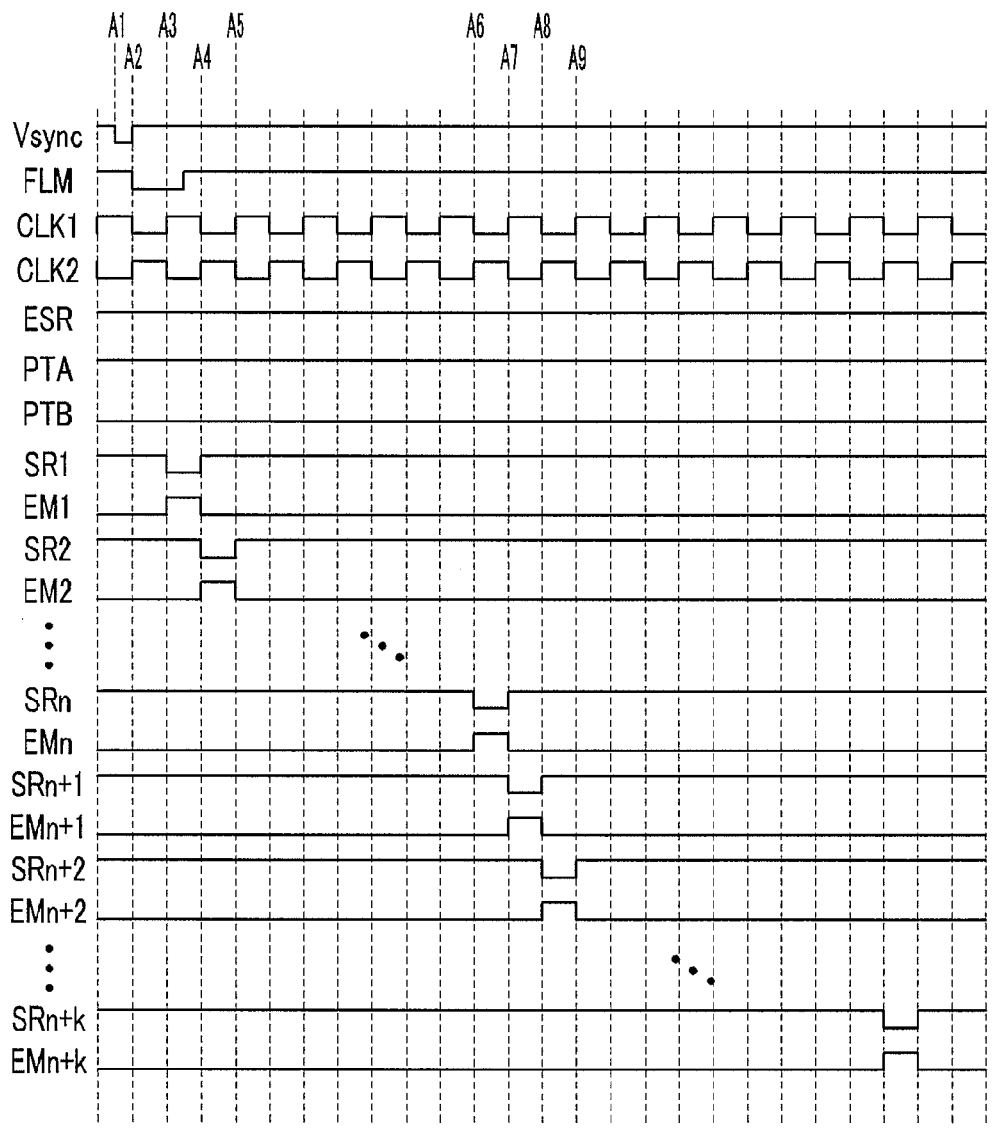
FIG. 7 and FIG. 8 are waveform diagrams for explaining an operation of the light emission driver 500 shown in FIG. 1 under a normal driving mode and under a partial driving mode, respectively.

FIG. 7 is a waveform of an operation of the light emission driver 500 shown in FIG. 1 under the normal driving mode.

Referring to FIGS. 5 and 7, the operation of the two-driver circuit 510 that includes the initial first and second normal drivers 510_1 and 510_2 will be described. First, when the vertical synchronization signal Vsync is generated as the low level pulse at a time A1, the synchronization signal FLM is generated concurrently (for example, in synchronization)

with the low level pulse of the first light emitting clock signal CLK1 at a time A2. Then, in the first normal driver 510_1, the first transistor P1 is turned on in accordance with the first light emitting clock signal CLK1, and the fourth transistor P4 is turned on in accordance with the synchronization signal FLM. Here, the fourth transistor P4 maintains the turn-on state during a time (for example, a predetermined time) in accordance with the voltage charged to the first capacitor C1.

Next, when the second light emitting clock signal CLK2 becomes the low voltage level at a time A3, the ninth transistor P9 is turned on such that the first shift signal SR1 becomes the second power source voltage VSS level. Further, the second power source voltage VSS is transmitted to the gate terminal of the tenth transistor P10 through the turned-on ninth transistor P9 such that the tenth transistor P10 is turned on, and the first light emitting signal EM1 is output at the first power source voltage VDD level. In addition, the sixth transistor P6 is turned on in accordance with the second light emitting clock signal CLK2, and the first power source voltage VDD is transmitted to the gate terminal of the eleventh transistor P11 through the turned-on sixth transistor P6 such that the eleventh transistor P11 is turned off.

Next, at a time A4, when the first light emitting clock signal CLK1 becomes the low voltage level, the seventh transistor P7 is turned on. Thus, the second power source voltage VSS is transmitted to the gate terminal of the eighth transistor P8 through the turned-on seventh transistor P7 such that the eighth transistor P8 is turned on. Accordingly, the first shift signal SR1 is output at the first power source voltage VDD level, and the tenth transistor P10 is turned off. In addition, the second power source voltage VSS is transmitted to the gate terminal of the eleventh transistor P11 through the turned-on seventh transistor P7 such that the eleventh transistor P11 is turned on, and the first light emitting signal EM1 is output at the second power source voltage VSS level.

The eleventh transistor P11 is maintained in the turned-on state in accordance with the first light emitting clock signal CLK1 and the voltage charged to the second capacitor C2 such that the first light emitting signal EM1 is maintained at the second power source voltage VSS level.

On the other hand, in the second normal driver 510_2, at the time A3, when the second light emitting clock signal CLK2 becomes the low voltage level, the first transistor P12 is turned on, and the fourth transistor P15 is turned on in accordance with the first shift signal SR1. Here, the fourth transistor P15 maintains the turn on state during a time (for example, a predetermined time) in accordance with the voltage charged to the first capacitor C3.

Next, at the time A4, when the first light emitting clock signal CLK1 becomes the low voltage level, the ninth transistor P20 is turned on. Thus, the second shift signal SR2 is output at the second power source voltage VSS level, and the tenth transistor P21 is turned on. Accordingly, the second light emitting signal EM2 is output at the first power source voltage VDD level. In addition, the sixth transistor P17 is turned on in accordance with the first light emitting clock signal CLK1, and the first power source voltage VDD is transmitted to the gate terminal of the eleventh transistor P22 through the turned-on sixth transistor P17 such that the eleventh transistor P22 is turned off.

Next, at a time A5, when the second light emitting clock signal CLK2 becomes the low voltage level, the seventh transistor P18 is turned on. Thus, the second power source voltage VSS is transmitted to the gate terminal of the eighth transistor P19 through the turned-on seventh transistor P18 such that the eighth transistor P19 is turned on. Thus, the second shift signal SR2 is output at the first power source voltage VDD level, and the tenth transistor P21 is turned off. In addition, the second power source voltage VSS is transmitted to the gate terminal of the eleventh transistor P22 through the turned-on seventh transistor P18 such that the eleventh transistor P22 is turned on, and the second light emitting signal EM2 is output at the second power source voltage VSS level.

The eleventh transistor P22 is maintained in the turned on state in accordance with the second light emitting clock signal CLK2 and the voltage charged to the second capacitor C4 such that the second light emitting signal EM2 is maintained at the second power source voltage VSS level. In this way, a plurality of light emitting signals EM1-EMn are sequentially generated at the second power source voltage VSS level starting from the time A4. In a similar fashion (only in response to the m-th shift signal SRm instead of the synchronization signal FLM), a plurality of light emitting signals EMm+1-EMn+k are sequentially generated at the second power source voltage VSS level after the plurality of light emitting signals EMn+1-EMm (described below) are generated.

Next, referring to FIGS. 6 and 7, the operation of the two-driver circuit 520 that includes first and second partial drivers 520_n+1 and 520_n+2 will be described. First, at a time A6, when the first light emitting clock signal CLK1 becomes the low voltage level, the first transistor P23 is turned on. Next, the fourth transistor P26 is turned on in accordance with the n-th shift signal SRn. Here, the fourth transistor P26 maintains the turn-on state during a time (for example, a predetermined time) in accordance with the voltage charged to the first capacitor C5.

At a time A7, when the second light emitting clock signal CLK2 becomes the low voltage level, the eleventh transistor P33 is turned on. Here, the inverted area selection signal PTB is at the low voltage level such that the twelfth transistor P34 and the seventh transistor P29 are turned on in accordance with the inverted area selection signal PTB. Accordingly, the (n+1)-th shift signal SRn+1 is output at the second power source voltage VSS level, and the thirteenth transistor P35 is turned on. Thus, the (n+1)-th light emitting signal EMn+1 is output at the first power source voltage VDD level. In addition, the sixth transistor P28 is turned on in accordance with the second light emitting clock signal CLK2, and the first power source voltage VDD is transmitted through the turned-on seventh transistor P29 and sixth transistor P28 to the gate terminal of the fourteenth transistor P36 such that the fourteenth transistor P36 is turned off.

Next, at a time A8, when the first light emitting clock signal CLK1 becomes the low voltage level, the eighth transistor P30 is turned on. Thus, the second power source voltage VSS is transmitted to the gate terminal of the tenth transistor P32 through the turned-on eighth transistor P30 such that the tenth transistor P32 is turned on. Accordingly, the (n+1)-th shift signal SRn+1 is output at the first power source voltage VDD level, and the thirteenth transistor P35 is turned off. In addition, the second power source voltage VSS is transmitted to the gate terminal of the fourteenth transistor P36 through the turned-on eighth transistor P30 such that the fourteenth transistor P36 is turned on, and the (n+1)-th light emitting signal EMn+1 is output at the second power source voltage VSS level.

The fourteenth transistor P36 is maintained in the turned-on state in accordance with the first light emitting clock signal CLK1 and the voltage charged to the second capacitor C6 such that the (n+1)-th light emitting signal EM_n+1 is maintained at the second power source voltage VSS level.

On the other hand, in the second partial driver 520_n+2, at the time A7, when the second light emitting clock signal CLK2 becomes the low voltage level, the first transistor P37 is turned on. In addition, the fourth transistor P40 is turned on in accordance with the (n+1)-th shift signal SRn+1. Here, the fourth transistor P40 maintains the turned on state during a time (for example, a predetermined time) in accordance with the voltage charged to the first capacitor C7.

At the time A8, when the first light emitting clock signal CLK1 is at the low voltage level, the eleventh transistor P47 is turned on. Here, the inverted area selection signal PTB is at the low voltage level such that the twelfth transistor P48 and the seventh transistor P43 are turned on in accordance with the inverted area selection signal PTB. Accordingly, the (n+2)-th shift signal SRn+2 is output at the second power source voltage VSS level, and the thirteenth transistor P49 is turned on. Thus, the (n+2)-th light emitting signal EMn+2 is output at the first power source voltage VDD level. In addition, the sixth transistor P42 is turned on in accordance with the first light emitting clock signal CLK1, and the first power source voltage VDD is transmitted through the turned-on seventh transistor P43 and sixth transistor P42 to the gate terminal of the fourteenth transistor P50 such that the fourteenth transistor P50 is turned off.

Next, at a time A9, when the second light emitting clock signal CLK2 becomes the low voltage level, the eighth transistor P44 is turned on. Thus, the tenth transistor P46 is turned on such that the (n+2)-th shift signal SRn+2 is output at the first power source voltage VDD level, and the thirteenth transistor P49 is turned off. In addition, the second power source voltage VSS is transmitted to the gate terminal of the fourteenth transistor P50 through the turned-on eighth transistor P44 such that the fourteenth transistor P50 is turned on, and the (n+2)-th light emitting signal EMn+2 is output at the second power source voltage VSS level.

The fourteenth transistor P50 is maintained in the turned-on state in accordance with the second light emitting clock signal CLK2 and the voltage charged to the second capacitor C8 such that the (n+2)-th light emitting signal EM_n+2 is maintained at the second power source voltage VSS level. In this way, the plurality of light emitting signals EMn+1-EMm are sequentially generated at the second power source voltage VSS level starting from the time A8. That is, under the normal driving mode, the plurality of partial drivers 520_n+1-520_m generate the plurality of light emitting signals EMn+1-EMm like the plurality of normal drivers 510_1-510_n and 510_m+1-510_n+k.

Figure 8:
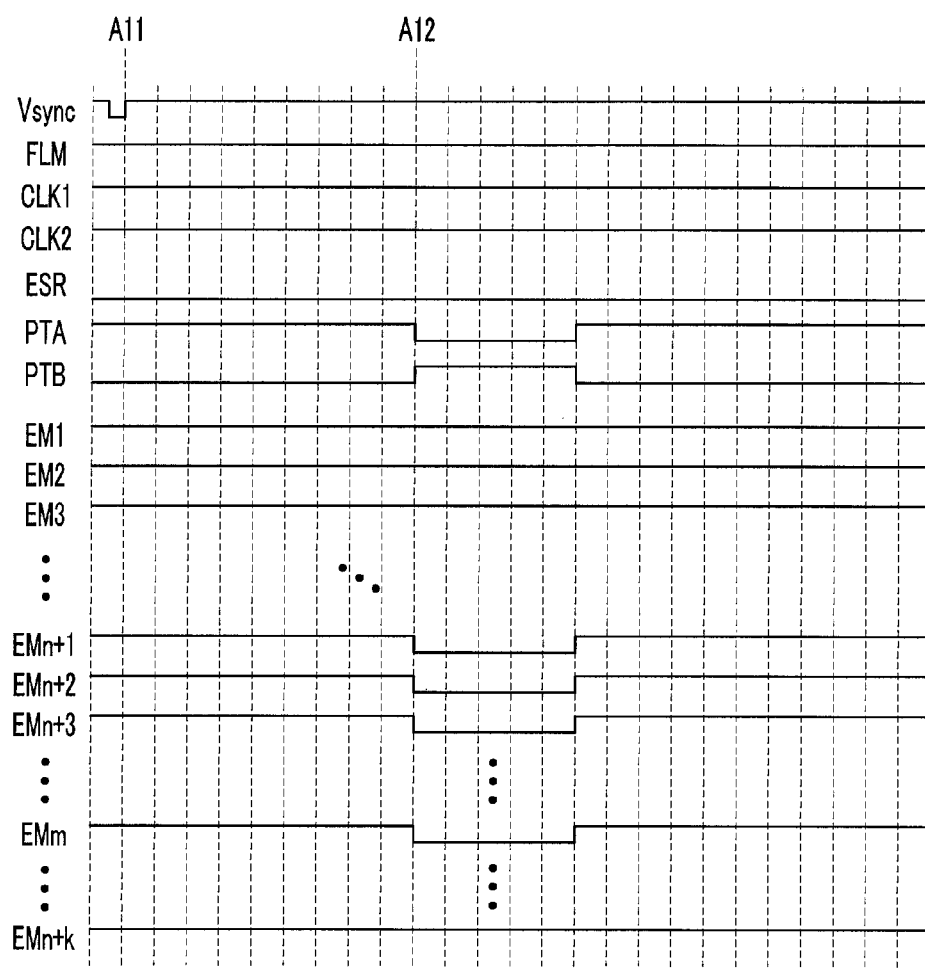

FIG. 8 is a waveform of the operation of the light emission driver 500 shown in FIG. 1 under the partial driving mode.

Referring to FIGS. 5 and 8, the operation of the two-driver circuit 510 that includes the first normal driver 510_1 and the second normal driver 510_2 will be described. At a time A11, the vertical synchronization signal Vsync is generated as the low-level pulse. Here, the synchronization signal FLM and the first and second light emitting clock signals CLK1 and CLK2 are generated at the high voltage level under the partial driving mode, and the partial driving selection signal ESR is generated at the low voltage level. Thus, in the first normal driver 510_1, the fifth transistor P5 is turned on (and accordingly, the sixth transistor P6 is turned on) in accordance with the partial driving selection signal ESR. Consequently, the second power source voltage VSS is transmitted to the gate terminal of the ninth transistor P9 through the turned-on fifth transistor P5 such that the ninth transistor P9 is turned on.

In addition, the first power source voltage VDD is transmitted to the gate terminal of the eighth transistor P8 through the turned-on sixth transistor P6 such that the eighth transistor P8 is turned off. Thus, the first shift signal SR1 is output at the second power source voltage VSS level. Further, the second power source voltage VSS is transmitted to the gate terminal of the tenth transistor P10 through the turned-on ninth transistor P9 such that the tenth transistor P10 is turned on, and the first light emitting signal EM1 is output at the first power source voltage VDD level.

Likewise, in the second normal driver 510_2, the fifth transistor P16 is turned on in accordance with the partial driving selection signal ESR. Thus, the second power source voltage VSS is transmitted to the gate terminal of the ninth transistor P20 through the turned-on fifth transistor P16 such that the ninth transistor P20 is turned on and the second shift signal SR2 is output at the second power source voltage VSS level. Further, the second power source voltage VSS is transmitted to the gate terminal of the tenth transistor P21 through the turned-on ninth transistor P20 such that the tenth transistor P21 is turned on, and the second light emitting signal EM2 is output at the first power source voltage VDD level. Accordingly, each of the first and second normal drivers 510_1 and 510_2 output the light emitting signal of the first power source voltage VDD level under the partial driving mode.

Referring now to FIGS. 6 and 8, the operation of the two-driver circuit 520 that includes the first partial driver 520_n+1 and the second partial driver 520_n+2 will be described. At the time A11, in the first partial driver 520_n+1, the fifth transistor P27 is turned on in accordance with the partial driving selection signal ESR. Thus, the second power source voltage VSS is transmitted to the gate terminal of the eleventh transistor P33 through the turned-on fifth transistor P27 such that the eleventh transistor P33 is turned on.

Here, the inverted area selection signal PTB is at the low voltage level, so the twelfth transistor P34 is also turned on, and the (n+1)-th shift signal SRn+1 is output at the second power source voltage VSS level. Further, the second power source voltage VSS is transmitted to the gate terminal of the thirteenth transistor P35 through the turned-on eleventh and twelfth transistors P33 and P34 such that the thirteenth transistor P35 is turned on, and the (n+1)-th light emitting signal EMn+1 is output at the first power source voltage VDD level.

Next, at a time A12, when the area selection signal PTA becomes the low voltage level, the ninth transistor P31 is turned on. Thus, the second power source voltage VSS is transmitted to the gate terminal of the tenth transistor P32 though the turned-on ninth transistor P31 such that the tenth transistor P32 is turned on, and the (n+1)-th shift signal SRn+1 is output at the first power source voltage VDD level. In addition, the second power source voltage VSS is transmitted to the gate terminal of the fourteenth transistor P36 through the turned-on ninth transistor P31 such that the fourteenth transistor P36 is turned on, and the (n+1)-th light emitting signal EMn+1 is output at the second power source voltage VSS level.

Likewise, in the second partial driver 520_2 at the time A12, when the area selection signal PTA becomes the low voltage level, the ninth transistor P45 is turned on. Thus, the second power source voltage VSS is transmitted to the gate terminal of the tenth transistor P46 through the turned-on ninth transistor P45 such that the tenth transistor P46 is turned on, and the (n+2)-th shift signal SRn+2 is output at the first power source voltage VDD level. In addition, the second power source voltage VSS is transmitted to the gate terminal of the fourteenth transistor P50 through the turned-on ninth transistor P45 such that the fourteenth transistor P50 is turned on, and the (n+2)-th light emitting signal EMn+2 is output at the second power source voltage VSS level.

That is, each of the first and second partial drivers 520_1 and 520_2 output the light emitting signal of the second power source voltage VSS level during the period in which the area selection signal PTA is at the low voltage level under the partial driving mode. Accordingly, the light emission driver 500 according to the above exemplary embodiment of FIG. 1 includes the partial drivers 520_n+1-520_m for light-emitting only the pixels PX corresponding to the display area DA under the partial driving mode such that the power consumption may be reduced.

Figure 9:
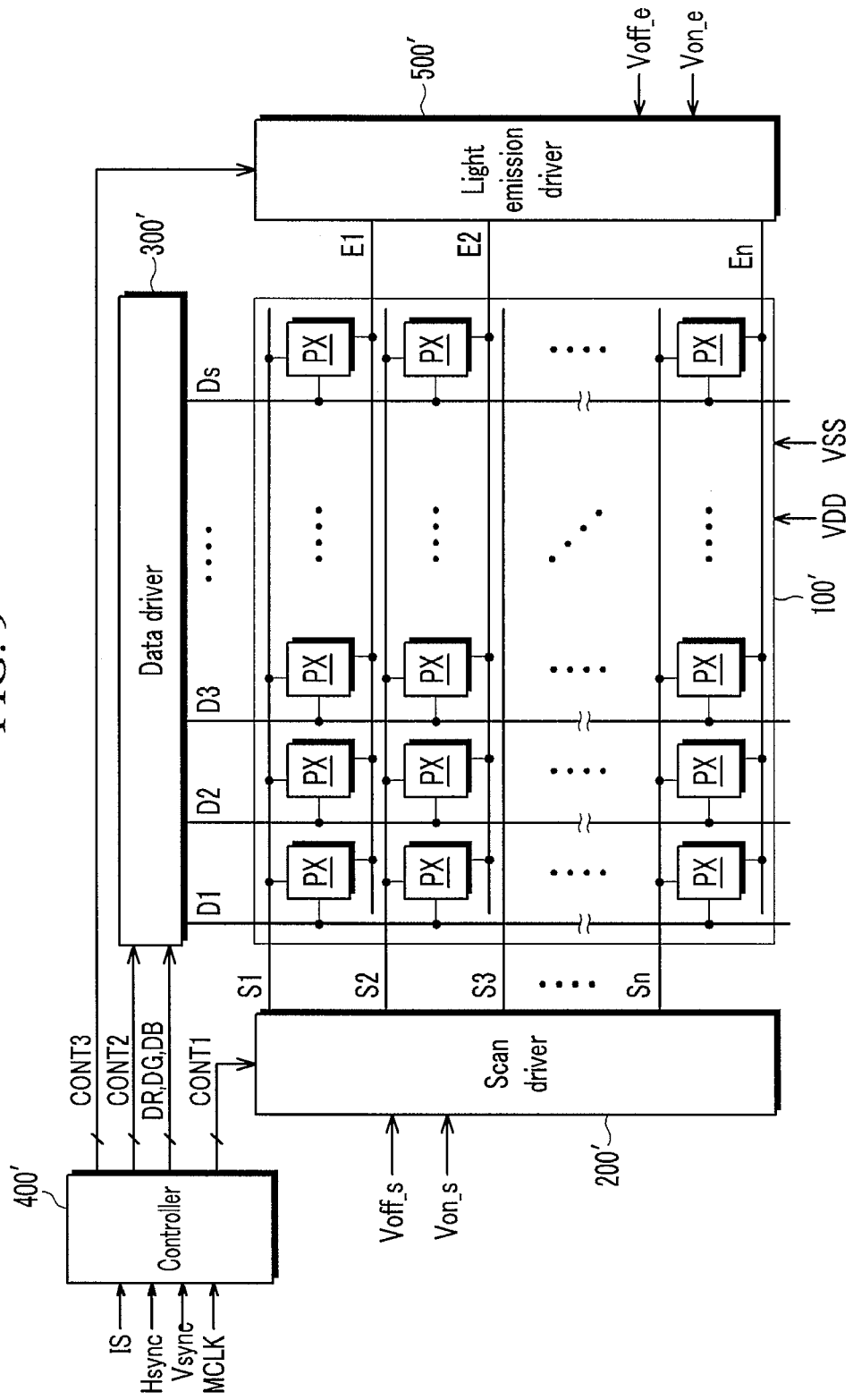
FIG. 9 is a block diagram of a display device according to another exemplary embodiment of the present invention.

FIG. 9 is a block diagram of a display device according to another exemplary embodiment of the present invention.

Referring to FIG. 9, a display device includes a display unit 100', a scan driver 200', a data driver 300', a controller 400', and a light emission driver 500'. The display unit 100' includes a plurality of signal lines S1-Sn, D1-Ds, and E1-En, and a plurality of pixels PX coupled thereto and arranged substantially in a matrix. The configurations of the pixels PX according to the exemplary embodiment of FIG. 9 are substantially the same as those of FIG. 2 and the description thereof is not repeated. The signal lines S1-Sn, D1-Ds, and E1-En include a plurality of scan lines S1-Sn for transmitting a plurality of scan signals SS1-SSn, a plurality of data lines D1-Ds for transmitting data voltages, and a plurality of light emitting signal lines E1-En for transmitting light emitting signals. The scan lines S1-Sn and the light emitting signal lines E1-En are arranged in the row direction and are substantially parallel to each other, and the data lines D1-Ds are arranged in the column direction and are substantially parallel to each other.

The scan driver 200' is coupled to the scan lines S1-Sn of the display unit 100', and sequentially applies the scan signals SS1-SSn to the scan lines S1-Sn according to the scan control signal CONT1.

The data driver 300' is coupled to the data lines D1 to Ds of the display unit 100. The data driver 300' converts image data DR, DG, and DB into data voltages and applies them to the data lines D1 to Ds in accordance with a data control signal CONT2. The data driver 300' transmits a plurality of non-light emitting data voltages to the plurality of data lines during the period in which the non-display area NDA receives the data voltages. The data driver 300' may divide the period in which the plurality of data voltages are transmitted to the display area DA and the non-display area NDA according to the area selection signal PTA.

For example, the data driver 300' transmits the plurality of data voltages to the plurality of data lines D1-Ds during the period in which the area selection signal PTA of the low voltage level is input, and transmits the plurality of non-light emitting data voltages to the plurality of data lines D1-Ds during the period in which the area selection signal PTA of the high voltage level is input. Hereinafter, a plurality of data voltages that are transferred to the display area DA are referred to as valid data VD, and a plurality of data voltages that are transferred to the non-display area NDA are referred to as invalid data NVD.

A pixel PX structure of the above embodiment is a voltage writing type of pixel structure. The data driver 300' generates a plurality of data voltages corresponding to the image data DR, DG, and DB and transfers the data voltages to the plurality of data lines D1-Dm. However, the present invention is not limited thereto. In other embodiments, when the OLED includes a current writing type of pixel structure, the data driver 300' generates a plurality of data currents corresponding to the image data DR, DG, and DB and transfers the data currents to the plurality of data lines D1-Dm.

The controller 400' receives input signals R, G, and B (also collectively denoted IS), a horizontal synchronization signal Hsync, a vertical synchronization signal Vsync, and a main clock signal MCLK from the outside to generate the image data DR, DG, and DB, the scan control signal CONT1, the data control signal CONT2, and a light emission control signal CONT3.

The scan control signal CONT1 includes a synchronization signal FLM, a first light emitting clock signal CLK1, a second light emitting clock signal CLK2, a first initialization signal INT1, and a second initialization signal INT2.

The synchronization signal FLM is generated concurrently (for example, in synchronization) with the vertical synchronization signal Vsync, and indicates a starting point of the frame. Here, the vertical synchronization signal Vsync has a period in which an image of a frame is displayed as a cycle, and includes a low-level pulse that instructs the start of a frame as a cycle unit.

The synchronization signal FLM includes a low-level pulse that is generated concurrently (for example, synchronized) with a low-level pulse of the first light emitting clock signal CLK1. The synchronization signal FLM is first generated after a time point at which a low-level pulse of the vertical synchronization signal Vsync is generated. The first light emitting clock signal CLK1 includes a plurality of low-level pulses that are generated according to a cycle (for example, a predetermined cycle). The second light emitting clock signal CLK2 is a clock signal in which the first light emitting clock signal CLK1 is shifted by half a cycle. The first and second light emitting clock signals CLK1 and CLK2 have the same frequency. The first initialization signal INT1 is generated with a phase delay (for example, a predetermined phase delay) relative to the second light emitting clock signal CLK2, and has the same frequency as that of the second light emitting clock signal CLK2. The second initialization signal INT2 is generated with a phase delay (for example, a predetermined phase delay) relative to the first light emitting clock signal CLK1, and has the same frequency as that of the first light emitting clock signal CLK1.

The data control signal CONT2 includes a horizontal synchronization start signal STH that notifies the start of transmitting the image data signals DR, DG, and DB for a row of pixels PX to the data driver 300', and a load signal LOAD that instructs the application of data voltages to the data lines D1-Ds. Further, the data control signal CONT2 according to the above exemplary embodiment of FIG. 9 includes a partial data driving signal PD for outputting valid data according to the area selection signal PTA.

The light emission control signal CONT3 includes the area selection signal PTA and the inverted area selection signal PTB. The area selection signal PTA includes information related to the display area DA, and is generated when the light emitting signal is applied to the light emitting signal lines corresponding to the display area DA among the plurality of light emitting signal lines E1-En. The inverted area selection signal PTB is an inverted signal of the area selection signal PTA. In an example of the above exemplary embodiment of FIG. 9, the area corresponding to the light emitting signal lines E5-E8 among the plurality of light emitting signal lines E1-En is the display area DA.

The light emission driver 500' is coupled to the plurality of light emitting signal lines E1-En of the display unit 100', and sequentially applies the plurality of light emitting signals EM1-EMn to the plurality of light emitting signal lines E1-En according to the light emission control signal CONT3 and the plurality of scan signals SS1-SSn. The light emission driver 500' according to the above exemplary embodiment of FIG. 9 directs the light emitting signal of the light emitting on voltage Von_e level to be applied to the light emitting signal lines corresponding to the display area DA among the plurality of light emitting signal lines E1-En, and the light emitting signal of the light emitting off voltage Voff_e level to be applied to the light emitting signal lines corresponding to the non-display area NDA among the plurality of light emitting signal lines E1-En.

Figure 10:
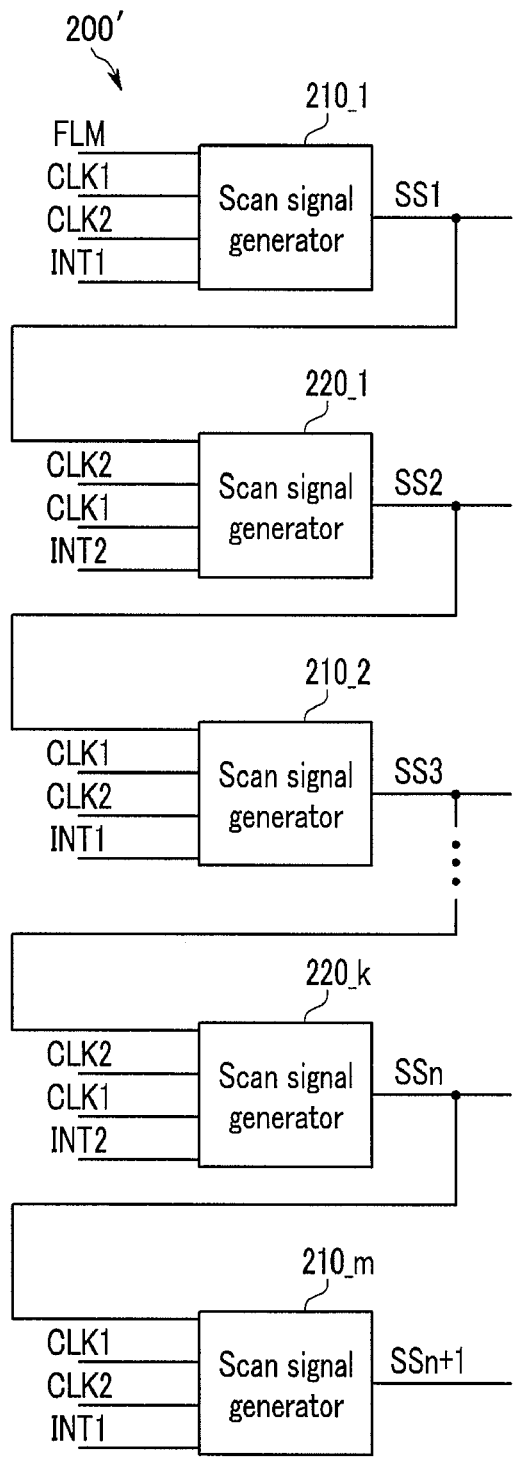
FIG. 10 is a block diagram of the scan driver 200' shown in FIG. 9.

FIG. 10 is a block diagram illustrating the scan driver 200' that is shown in FIG. 9.

Referring to FIG. 10, the scan driver 200' includes a plurality of first scan signal generators 210_1-210_m for generating odd-numbered scan signals among the plurality of scan signals SS1-SSn, and a plurality of second scan signal generators 220_1-220_k for generating even-numbered scan signals among the plurality of scan signals SS1-SSn (here, m+k=n+1). The scan signal generator (in FIG. 10, shown as first scan signal generator 210_m) for generating the final scan signal SSn+1 of the plurality of scan signals SS1-SSn+1 as a dummy scan signal generator is actually not coupled to the pixels PX, and executes the function for generating the n-th light emitting signal EMn.

The plurality of first scan signal generators 210_1-210_m are for receiving the first initialization signal INT1 and the first and second light emitting clock signals CLK1 and CLK2. In addition, each of the plurality of first scan signal generators 210_2-210_m receives the (previous) scan signal output from one of the plurality of second scan signal generators 220_1-220_k that is earlier than (in front of) and adjacent to the first scan signal generator. The plurality of first scan signal generators 210_1-210_m operate in accordance with (for example, are synchronized to) the first light emitting clock signal CLK1 to output one of the second light emitting clock signal CLK2 or the first power source voltage VDD as their scan signals according to the corresponding previous scan signals and the first initialization signal INT1.

Here, the initial first scan signal generator 210_1 among the plurality of first scan signal generators 210_1-210_m receives the synchronization signal FLM instead of the previous scan signal. Accordingly, the initial first scan signal generator 210_1 operates in accordance (for example, is in synchronization) with the first light emitting clock signal CLK1 to output one of the second light emitting clock signal CLK2 or the first power source voltage VDD as the first scan signal SS1 according to the synchronization signal FLM and the first initialization signal INT1.

The plurality of second scan signal generators (220_1-220_k) are for receiving the second initialization signal INT2 and the first and second light emitting clock signals CLK1 and CLK2. In addition, each of the plurality of second scan signal generators 220_1-220_k receives the (previous) scan signal output from one of the plurality of first scan signal generators 210_1-210_m-1 that is earlier than (in front of) and adjacent to the second scan signal generator. The plurality of second scan signal generators 220_1-220_m operate in accordance (for example, are in synchronization) with the second light emitting clock signal CLK2 to output one of the first light emitting clock signal CLK1 or the first power source voltage VDD as their scan signals according to the corresponding previous scan signals and the second initialization signal INT2.

Figure 11:
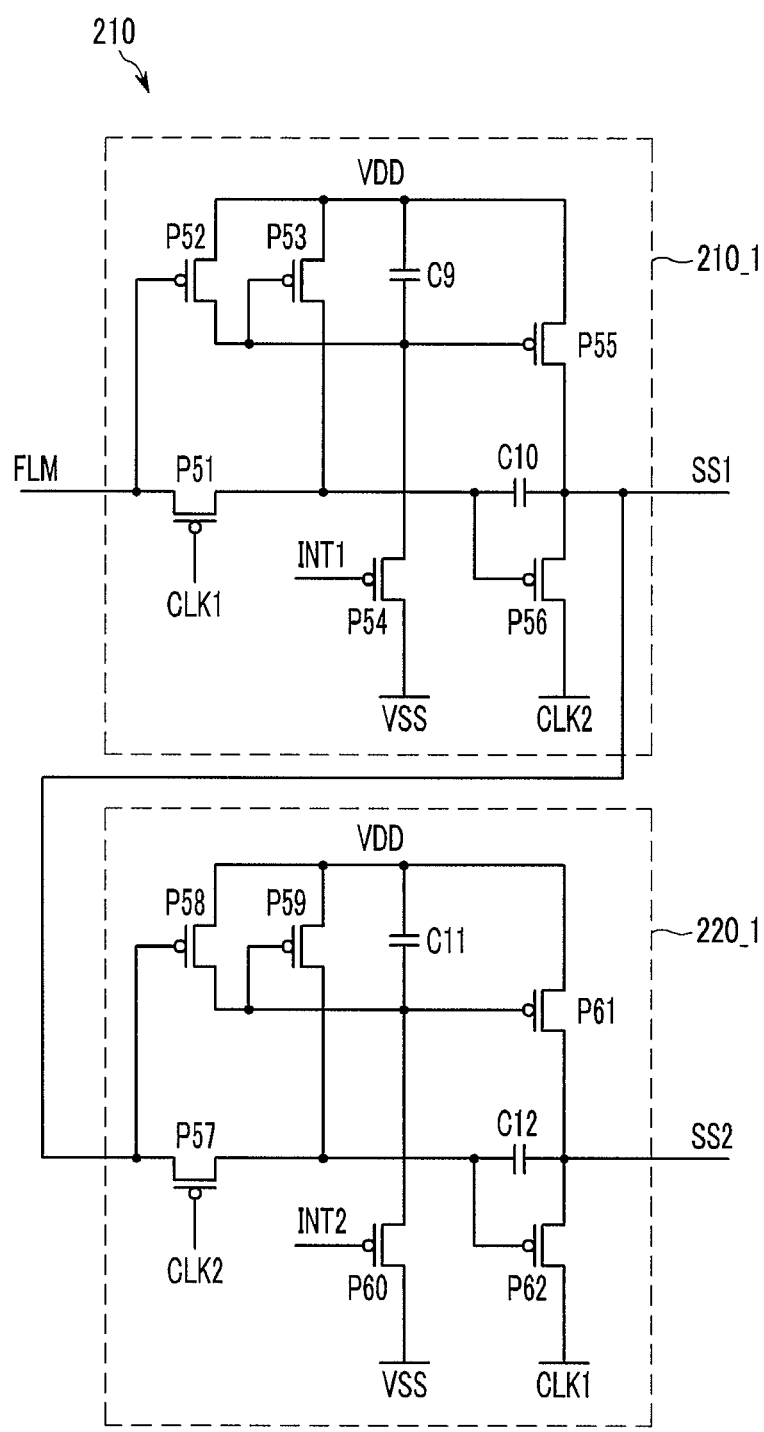
FIG. 11 is a detailed circuit diagram of the scan driver 200' shown in FIG. 9.

FIG. 11 is a detailed circuit diagram of the scan driver 200' shown in FIG. 9. FIG. 11 only shows a two-generator circuit 210 that includes the initial first and second scan signal generators 210_1 and 220_1 for better understanding and ease of description. However, the circuit configuration of the remaining first and second scan signal generators is substantially the same in one embodiment.

Referring to FIG. 11, the first scan signal generator 210_1 includes first through sixth transistors P51-P56 and first and second capacitors C9 and C10. The first transistor P51 includes a gate terminal for receiving the first light emitting clock signal CLK1 and a drain terminal for receiving the synchronization signal FLM. The second transistor P52 includes a gate terminal coupled to the drain terminal of the first transistor P51 and a source terminal coupled to the first power source VDD. The third transistor P53 includes a gate terminal coupled to a drain terminal of the second transistor P52, a source terminal coupled to the first power source VDD, and a drain terminal coupled to a source terminal of the first transistor P51. The first capacitor C9 includes one terminal coupled to the first power source VDD and another terminal coupled to the gate terminal of the third transistor P53.

The fourth transistor P54 includes a gate terminal for receiving the first initialization signal INT1, a source terminal coupled to the other terminal of the first capacitor C9, and a drain terminal coupled to the second power source VSS. The fifth transistor P55 includes a gate terminal coupled to the other terminal of the first capacitor C9 and a source terminal coupled to the first power source VDD. The sixth transistor P56 includes a gate terminal coupled to the drain terminal of the third transistor P53, a source terminal coupled to a drain terminal of the fifth transistor P55, and a drain terminal for receiving the second light emitting clock signal CLK2. The node of the drain terminal of the fifth transistor P55 and the source terminal of the sixth transistor P56 becomes an output terminal of the first scan signal SS1. The second capacitor C10 includes one terminal coupled to the gate terminal of the sixth transistor P56 and another terminal coupled to the source terminal of the sixth transistor P56.

The second scan signal generator 220_1 includes first through sixth transistors P57-P62 and first and second capacitors C11 and C12. The first transistor P57 includes a gate terminal for receiving the second light emitting clock signal CLK2 and a drain terminal for receiving the first scan signal SS1. The second transistor P58 includes a gate terminal coupled to the drain terminal of the first transistor P57 and a source terminal coupled to the first power source VDD. The third transistor P59 includes a gate terminal coupled to a drain terminal of the second transistor P58, a source terminal coupled to the first power source VDD, and a drain terminal coupled to a source terminal of the first transistor P57. The first capacitor C11 includes one terminal coupled to the first power source VDD and another terminal coupled to the gate terminal of the third transistor P59.

The fourth transistor P60 includes a gate terminal for receiving the second initialization signal INT2, a source terminal coupled to the other terminal of the first capacitor C11, and a drain terminal coupled to the second power source VSS. The fifth transistor P61 includes a gate terminal coupled to the other terminal of the first capacitor C11 and a source terminal coupled to the first power source VDD. The sixth transistor P62 includes a gate terminal coupled to the drain terminal of the third transistor P59, a source terminal coupled to a drain terminal of the fifth transistor P61, and a drain terminal for receiving the first light emitting clock signal CLK1. The node of the drain terminal of the fifth transistor P61 and the source terminal of the sixth transistor P62 becomes an output terminal of the second scan signal SS2. The second capacitor C12 includes one terminal coupled to the gate terminal of the sixth transistor P62 and another terminal coupled to the source terminal of the sixth transistor P62.

Figure 12:
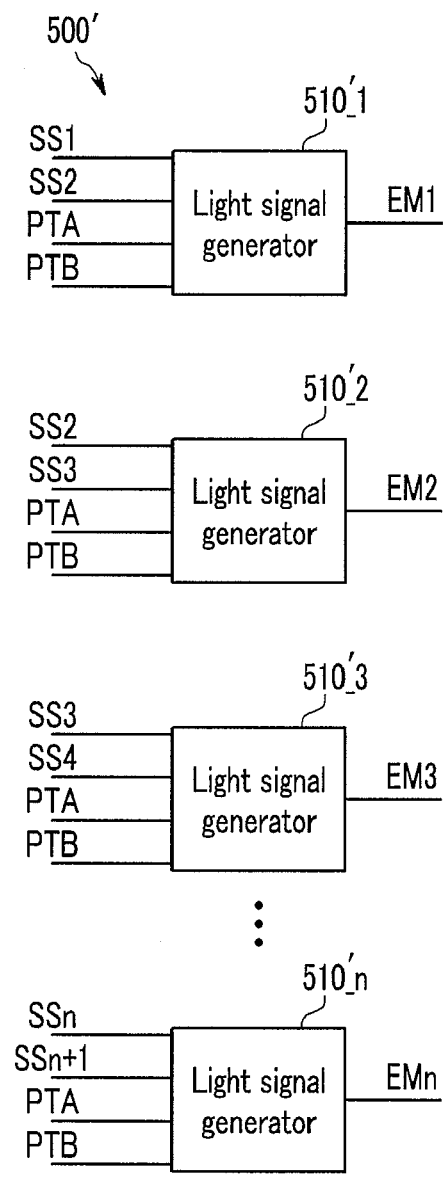
FIG. 12 is a block diagram of the light emission driver 500' shown in FIG. 9.

FIG. 12 is a block diagram of the light emission driver 500' shown in FIG. 9.

Referring to FIG. 12, the light emission driver 500' according to the above exemplary embodiment of FIG. 9 includes a plurality of light emitting signal generators 510'_1-510'_n. Each of the plurality of light emitting signal generators

510'_1-510'_n (for example, an i-th light emitting signal generator 510'_i) receives the area selection signal PTA, the inverted area selection signal PTB, the i-th scan signal SSi, and the (i+1)-th scan signal SS_i+1 among the plurality of scan signals SS1-SSn. Each of the plurality of light emitting signal generators 510'_1-510'_n (for example, the i-th light emitting signal generator 510'_i) outputs the first power source voltage VDD as the i-th light emitting signal EMi according to the i-th scan signal SSi, and outputs the second power source voltage VSS as the light emitting signal EMi according to the area selection signal PTA and the (i+1)-th scan signal SS_i+1.

Figure 13:
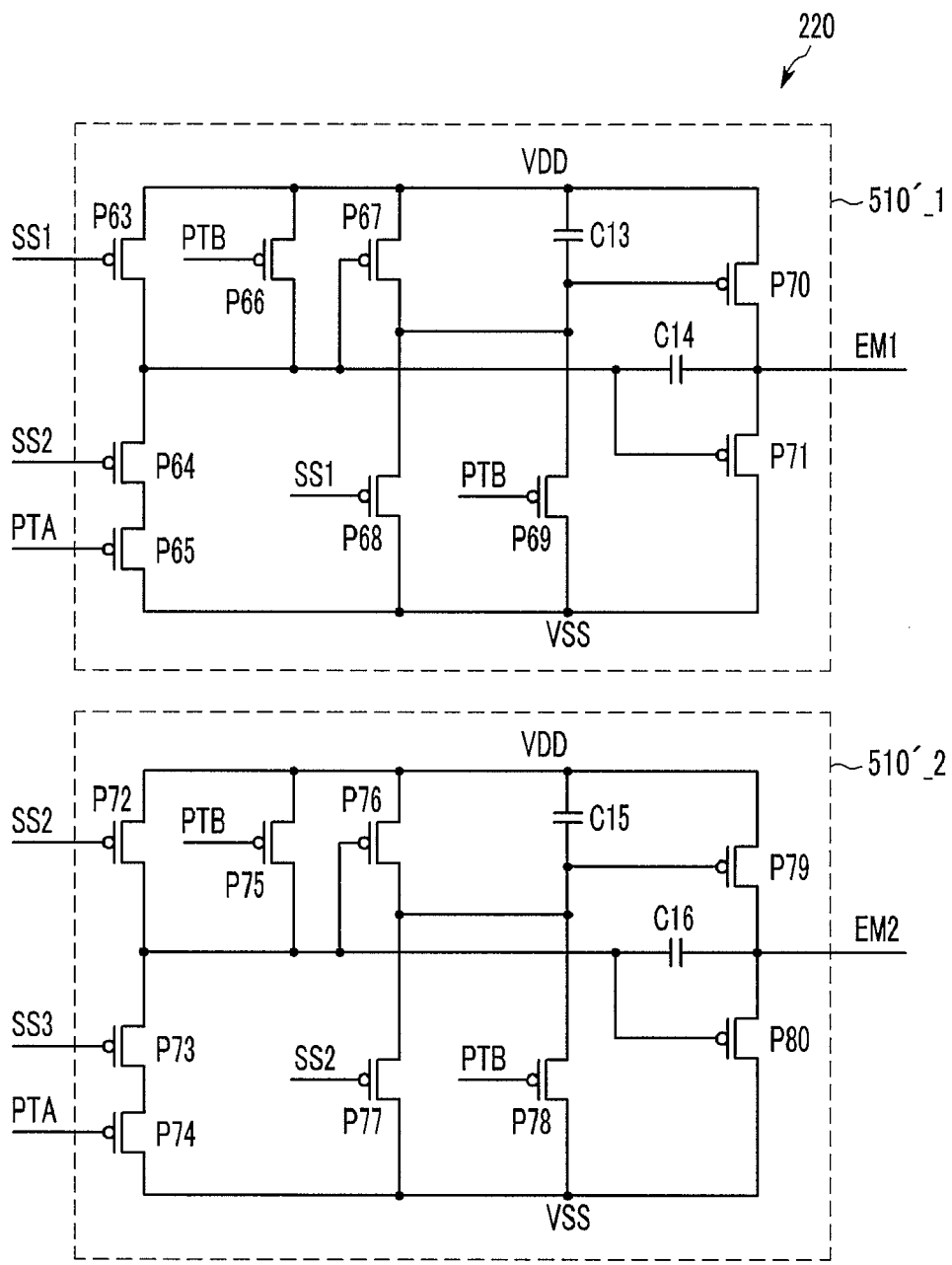
FIG. 13 is a detailed circuit diagram of the light emission driver 500' shown in FIG. 9.

FIG. 13 is a detailed circuit diagram of the light emission driver 500' shown in FIG. 9. FIG. 13 only shows a two-generator circuit 220 including the first and second light emitting signal generators 510'_1 and 510'_2 for better understanding and ease of description, and the circuit configuration of the remaining light emitting signal generators is substantially the same in one embodiment.

Referring to FIG. 13, the first light emitting signal generator 510'_1 includes first through ninth transistors P63-P71 and first and second capacitors C13 and C14. The first transistor P63 includes a gate terminal for receiving the first scan signal SS1 and a source terminal coupled to the first power source VDD. The second transistor P64 includes a gate terminal for receiving the second scan signal SS2 and a source terminal coupled to a drain terminal of the first transistor P63. The third transistor P65 includes a gate terminal for receiving the area selection signal PTA, a source terminal coupled to a drain terminal of the second transistor P64, and a drain terminal coupled to the second power source VSS. The fourth transistor P66 includes a gate terminal for receiving the inverted area selection signal PTB, a source terminal coupled to the first power source VDD, and a drain terminal coupled to the drain terminal of the first transistor P63.

The first capacitor C13 includes one terminal coupled to the first power source VDD. The fifth transistor P67 includes a gate terminal coupled to the drain terminal of the fourth transistor P66, a source terminal coupled to the first power source VDD, and a drain terminal coupled to another terminal of the first capacitor C13. The sixth transistor P68 includes a gate terminal for receiving the first scan signal SS1, a source terminal coupled to the drain terminal of the fifth transistor P67, and a drain terminal coupled to the second power source VSS. The seventh transistor P69 includes a gate terminal for receiving the inverted area selection signal PTB, a source terminal coupled to the other terminal of the first capacitor C13, and a drain terminal coupled to the second power source VSS.

The eighth transistor P70 includes a gate terminal coupled to the other terminal of the first capacitor C13 and a source terminal coupled to the first power source VDD. The ninth transistor P71 includes a gate terminal coupled to the gate terminal of the fifth transistor P67, a source terminal coupled to a drain terminal of the eighth transistor P70, and a drain terminal coupled to the second power source VSS. The node of the drain terminal of the eighth transistor P70 and the source terminal of the ninth transistor P71 becomes an output terminal of the first light emitting signal EM1. The second capacitor C14 includes one terminal coupled to the gate terminal of the ninth transistor P71 and another terminal coupled to the source terminal of the ninth transistor P71.

The second light emitting signal generator 510'_2 includes first through ninth transistors P72-P80 and first and second capacitors C15 and C16. The first transistor P72 includes a gate terminal for receiving the second scan signal SS2 and a source terminal coupled to the first power source VDD. The second transistor P73 includes a gate terminal for receiving the third scan signal SS3 and a source terminal coupled to a drain terminal of the first transistor P72. The third transistor P74 includes a gate terminal for receiving the area selection signal PTA, a source terminal coupled to a drain terminal of the second transistor P73, and a drain terminal coupled to the second power source VSS. The fourth transistor P75 includes a gate terminal for receiving the inverted area selection signal PTB, a source terminal coupled to the first power source VDD, and a drain terminal coupled to the drain terminal of the first transistor P72.

The first capacitor C15 includes one terminal coupled to the first power source VDD. The fifth transistor P76 includes a gate terminal coupled to the drain terminal of the fourth transistor P75, a source terminal coupled to the first power source VDD, and a drain terminal coupled to another terminal of the first capacitor C15. The sixth transistor P77 includes a gate terminal for receiving the second scan signal SS2, a source terminal coupled to the drain terminal of the fifth transistor P76, and a drain terminal coupled to the second power source VSS. The seventh transistor P78 includes a gate terminal for receiving the inverted area selection signal PTB, a source terminal coupled to the other terminal of the first capacitor C15, and a drain terminal coupled to the second power source VSS.

The eighth transistor P79 includes a gate terminal coupled to the other terminal of the first capacitor C15 and a source terminal coupled to the first power source VDD. The ninth transistor P80 includes a gate terminal coupled to the gate terminal of the fifth transistor P76, a source terminal coupled to a drain terminal of the eighth transistor P79, and a drain terminal coupled to the second power source VSS. The node of the drain terminal of the eighth transistor P79 and the source terminal of the ninth transistor P80 becomes an output terminal of the second light emitting signal EM2. The second capacitor C16 includes one terminal coupled to the gate terminal of the ninth transistor P80 and another terminal coupled to the source terminal of the ninth transistor P80.

Figure 14:
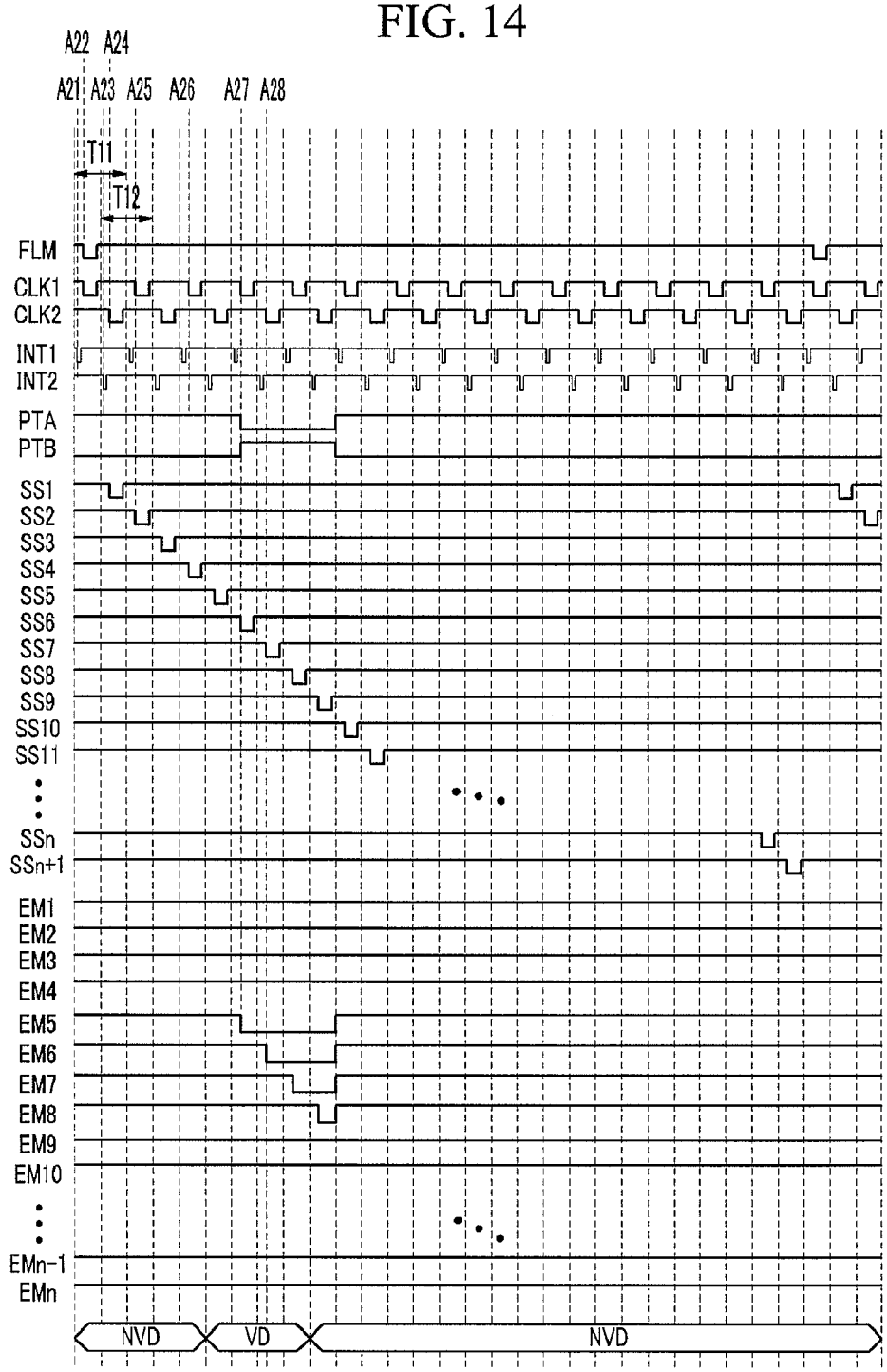
FIG. 14 is a timing diagram for explaining a driving method of a display device according to an exemplary embodiment of FIG. 9.

FIG. 14 is a timing diagram for explaining a driving method of a display device according to the above exemplary embodiment of FIG. 9. In FIG. 14, a period T11 represents one cycle of the first initialization signal INT1, and a period T12 represents one cycle of the second initialization signal INT2. FIG. 14 illustrates an entire vertical synchronization cycle, where the display area DA is assumed (by way of example) to include the 5th through 8th lines (corresponding to scan lines S5-S8 and light emitting signal lines E5-E8) of the display unit 100' and the non-display area NDA includes the remaining lines of the display unit 100'. As such, valid data VD is transmitted from the data driver 300' to the plurality of data lines D1-Ds during the portion corresponding to scan signals SS5-SS8 while invalid data NVD is transmitted from the data driver 300' to the plurality of data lines D1-Ds at other times.

Referring to FIGS. 11 and 14, when the first initialization signal INT1 is generated at the low voltage level at a time A21, the fourth transistor P54 is turned on. Thus, the second power source voltage VSS is transmitted to the gate terminal of the fifth transistor P55 through the turned-on fourth transistor P54 such that the fifth transistor P55 is turned on, and the first scan signal SS1 maintains the first power source voltage VDD level.

Next, at a time A22, when the synchronization signal FLM is generated as the pulse of the low voltage level, the first light emitting clock signal CLK1 is generated at the low voltage level. Thus, the first transistor P51 is turned on and, consequently, the sixth transistor P56 is turned on in accordance with the synchronization signal FLM transmitted though the turned-on first transistor P51. The sixth transistor P56 maintains the turned-on state in accordance with the synchronization signal FLM and the voltage charged to the second capacitor C10 until the next cycle of the first initialization signal INT1. Accordingly, the second light emitting clock signal CLK2 is generated as the first scan signal SS1. The first scan signal SS1 is generated as the second light emitting clock signal CLK2 during one cycle of the first initialization signal INT1, which is the period T11.

When the second initialization signal INT2 is generated at the low voltage level at a time A23, the fourth transistor P60 is turned on. Thus, the second power source voltage VSS is transmitted to the gate terminal of the fifth transistor P61 through the turned-on fourth transistor P60 such that the fifth transistor P61 is turned on, and the second scan signal SS2 is generated at the first power source voltage VDD level.

Next, the first transistor P57 is turned on in accordance with the second light emitting clock signal CLK2 at a time A24, and the sixth transistor P62 is turned on in accordance with the first scan signal SS1 transmitted through the turned-on first transistor P57. Accordingly, the first light emitting clock signal CLK1 is generated as the second scan signal SS2 (in a manner similar to that of the first scan signal SS1 described above). The second scan signal SS2 is generated as the first light emitting clock signal CLK1 during one cycle of the second initialization signal INT2, which is the period T12. As described above, the scan signals SS1-SSn are sequentially output.

On the other hand, referring now to FIGS. 13 and 14, at the time A24 in the first light emitting signal generator 510'_1, when the first scan signal SS1 is generated at the low voltage level, the first transistor P63 and the sixth transistor P68 are turned on, which turns on the eighth transistor P70 and turns off the ninth transistor P71. Thus, the first light emitting signal EMI is generated at the first power source voltage VDD level. Next, at a time A25, the first scan signal SS1 becomes the high voltage level, and the second scan signal SS2 is generated at the low voltage level. Thus, the first transistor P63 and the sixth transistor P68 are turned off, and the second transistor P64 is turned on.

Here, however, the area selection signal PTA is at the high voltage level while the inverted area selection signal PTB is at the low voltage level such that the third transistor P65 is turned off, while the fourth transistor P66 and the seventh transistor P69 are turned on. Accordingly, the eighth transistor P70 remains turned on while the ninth transistor remains turned off such that the first light emitting signal EM1 maintains the first power source voltage VDD level. As described above, the light emitting signal corresponding to the period in which the area selection signal PTA is at the high voltage level is output at the first power source voltage VDD level. In the above example for the timing diagram of FIG. 14, this applies not only to the first light emitting signal generator 510'_1, but also to the second light emitting signal generator 510'_2 and succeeding light emitting signal generators which receive scan signal input signals while the area selection signal PTA is at the high voltage level (for example, at a time A26).

Next, at a time A27, the area selection signal PTA switches to the low voltage level, concurrently with the sixth scan signal SS6 being generated at the low voltage level. This causes the above light emitting signal generation to change starting with the fifth light emitting signal generator 510'_5 (as described below). For the sake of convenience, it should be noted that the first and second light emitting signal generators 510'_1 and 510'_2 depicted in FIG. 13 have similar circuit designs to the fifth and sixth light emitting signal generators 510'_5 and 510'_6. The main difference is the scan signal inputs, which differ by four between them (e.g., first and second scan signals SS1 and SS2 in first light emitting signal generator 510'_1 correspond to fifth and sixth scan signals SS5 and SS6 in fifth light emitting signal generator 510'_5). Accordingly, in the description that follows, fifth and sixth light emitting signal generators 510'_5 and 510'_6 will be described referring to the corresponding components of first and second light emitting signal generators 510'_1 and 510'_2 of FIG. 13.

At a time A27, when the area selection signal PTA is changed from the high voltage level to the low voltage level, the third transistor P65 is turned on. In addition, the sixth scan signal SS6 is generated at the low voltage level, which turns on the second transistor P64. Here, the fifth scan signal SS5 is at the high voltage level such that the first transistor P63 and the sixth transistor P68 are the turned-off state. Further, the inverted area selection signal PTB changes from the low voltage level to the high voltage level such that the fourth transistor P66 and the seventh transistor P69 enter the turned-off state.

Consequently, the second power source voltage VSS is transmitted to the gate of the fifth transistor P67 through the turned-on third transistor P65 and second transistor P64 such that the fifth transistor P67 is turned on. Thus, the fifth transistor P67 transmits the first power source voltage VDD to the gate terminal of the turned-on eighth transistor P70 and the eighth transistor P70 is turned off. Further, the gate terminal of the ninth transistor P71 receives the second power source voltage VSS such that the ninth transistor P71 is turned on. Accordingly, the fifth light emitting signal EM5 is output at the second power source voltage VSS level.

Likewise, at a time A28, when the seventh scan signal SS7 is generated at the low voltage level, the second transistor P73 is turned on. Thus, the second power source voltage VSS is transmitted to the gate terminal of the ninth transistor P80 such that the ninth transistor P80 is turned on. Accordingly, the sixth light emitting signal EM6 is output at the second power source voltage VSS level (in a manner similar to that of the fifth light emitting signal EM5 described above).

As described above, the fifth through eighth light emitting signals EM5-EM8 corresponding to the period in which the area selection signal PTA is at the low voltage level is output at the second power source voltage VSS level. Accordingly, only the plurality of pixels PX coupled to the fifth through eighth light emitting signal lines E5-E8 emit light, thereby reducing power consumption.

The valid data VD is modulated to compensate decreasing light emitting periods according to decreasing on-periods (low level) of the fifth through eighth light emitting signals EM5-EM8. When the driving transistor M1 is a p-channel type transistor, as in FIG. 2, the valid data VD is decreased from the fifth line to the eighth line. Data voltages transmitted to data lines D1-Dn according to the valid data VD are decreased from the fifth line to the eighth line to compensate decreasing light emitting periods of the fifth through eighth lines.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME REFERENCE NUMERALS display unit 100
scan driver 200 data driver 300
controller 400
light emission driver 500
scan line S1-Sn+k
light emitting signal line E1-En+k
data line D1-Ds
driving transistor M1
storage capacitor Cst
switching transistor M2
light emission control transistor M3
organic light emitting diode OLED
input signal R, G, B
horizontal synchronization signal Hsync
vertical synchronization signal Vsync
main clock signal MCLK
image data DR, DG, DB
scan control signal CONT1
data control signal CONT2
light emission control signal CONT3
partial driving selection signal ESR
inverted area selection signal PTB
area selection signal PTA
normal driver 510_1-510_n+k
partial driver 520_1-520_m

What is claimed is:

1. A display device comprising:
a display unit comprising a plurality of scan lines for transmitting a plurality of scan signals, a plurality of data lines for transmitting a plurality of data signals, a plurality of light emitting signal lines for transmitting a plurality of light emitting signals, and a plurality of pixels coupled to the plurality of scan lines, the plurality of data lines, and the plurality of light emitting signal lines; and
a light emission driver for receiving a partial driving selection signal for selecting one of a normal driving mode or a partial driving mode, an area selection signal for dividing a frame into an emission period and a non-emission period, a synchronization signal generated in synchronization with a vertical synchronization signal, a first light emitting clock signal, and a second light emitting clock signal having a phase difference from the first light emitting clock signal, the light emission driver being configured to output the plurality of light emitting signals,
wherein the plurality of light emitting signal lines comprises a plurality of first light emitting signal lines for defining a non-display area of the display unit and a plurality of second light emitting signal lines for defining a display area of the display unit,
wherein the non-display area and display area are fixed,
wherein the light emission driver comprises:
a plurality of normal drivers respectively coupled to the plurality of first light emitting signal lines, for outputting a plurality of first light emitting signals among the plurality of light emitting signals at an on voltage level under the normal driving mode, and for outputting the plurality of first light emitting signals at an off voltage level under the partial driving mode; and
a plurality of partial drivers respectively coupled to the plurality of second light emitting signal lines, for outputting a plurality of second light emitting signals among the plurality of light emitting signals at the on voltage level according to the area selection signal under the partial driving mode, and
wherein the plurality of partial drivers comprises:
a first partial driver for receiving the first light emitting clock signal, the second light emitting clock signal, the area selection signal, an inverted area selection signal in which the area selection signal is inverted, the partial driving selection signal, and a third shift signal, and for generating a third light emitting signal of the plurality of light emitting signals at a second power source voltage according to the area selection signal when the partial driving selection signal is at a second level; and
a second partial driver for receiving the first light emitting clock signal, the second light emitting clock signal, the area selection signal, the inverted area selection signal, and a fourth shift signal, and for generating a fourth light emitting signal of the plurality of light emitting signals at the second power source voltage according to the area selection signal.

2. The display device of claim 1, wherein the plurality of normal drivers comprise:
a first normal driver for receiving the first light emitting clock signal, the partial driving selection signal, and a first input signal, for receiving the second light emitting clock signal in accordance with the first input signal when the partial driving selection signal is at a first level different than the second level, and for generating a first shift signal according to the second light emitting clock signal, and a first light emitting signal of the plurality of light emitting signals in which the first shift signal is inverted; and
a second normal driver for receiving a second input signal, the partial driving selection signal, and the second light emitting clock signal, for receiving the first light emitting clock signal in accordance with the second input signal when the partial driving selection signal is at the first level, and for generating a second shift signal according to the first light emitting clock signal, and a second light emitting signal of the plurality of light emitting signals in which the second shift signal is inverted.

3. The display device of claim 2, wherein the first input signal is one of the second shift signal or the synchronization signal.

4. The display device of claim 2, wherein the second input signal is the first shift signal.

5. The display device of claim 2, wherein the first normal driver comprises:
a first transistor comprising a gate terminal for receiving the first light emitting clock signal and a second terminal for receiving the first input signal;
a second transistor comprising a gate terminal for receiving the partial driving selection signal, a first terminal coupled to a first power source, and a second terminal coupled to a first terminal of the first transistor;
a third transistor comprising a gate terminal for receiving the first light emitting clock signal and a first terminal coupled to the first power source;
a first capacitor comprising one terminal coupled to the second terminal of the second transistor and another terminal coupled to a second terminal of the third transistor;
a fourth transistor comprising a gate terminal coupled to the one terminal of the first capacitor, a first terminal coupled to the other terminal of the first capacitor, and a second terminal for receiving the second light emitting clock signal;
a fifth transistor comprising a gate terminal for receiving the partial driving selection signal, a first terminal coupled to the other terminal of the first capacitor, and a second terminal coupled to a second power source;
a sixth transistor comprising a gate terminal coupled to the other terminal of the first capacitor and a first terminal coupled to the first power source;
a seventh transistor comprising a gate terminal for receiving the first light emitting clock signal, a first terminal coupled to a second terminal of the sixth transistor, and a second terminal coupled to the second power source;
an eighth transistor comprising a gate terminal coupled to the second terminal of the sixth transistor and a first terminal coupled to the first power source;
a ninth transistor comprising a gate terminal coupled to the other terminal of the first capacitor, a first terminal coupled to a second terminal of the eighth transistor, and a second terminal coupled to the second power source;
a tenth transistor comprising a gate terminal coupled to the second terminal of the eighth transistor and a first terminal coupled to the first power source;
a second capacitor comprising one terminal coupled to the gate terminal of the eighth transistor and another terminal coupled to a second terminal of the tenth transistor; and
an eleventh transistor comprising a gate terminal coupled to the one terminal of the second capacitor, a first terminal coupled to the other terminal of the second capacitor, and a second terminal coupled to the second power source.

6. The display device of claim 2, wherein the second normal driver comprises:
a first transistor comprising a gate terminal for receiving the second light emitting clock signal and a second terminal for receiving the second input signal;
a second transistor comprising a gate terminal for receiving the partial driving selection signal, a first terminal coupled to a first power source, and a second terminal coupled to a first terminal of the first transistor;
a third transistor comprising a gate terminal for receiving the second light emitting clock signal and a first terminal coupled to the first power source;
a first capacitor comprising one terminal coupled to the second terminal of the second transistor and another terminal coupled to a second terminal of the third transistor;
a fourth transistor comprising a gate terminal coupled to the one terminal of the first capacitor, a first terminal coupled to the other terminal of the first capacitor, and a second terminal for receiving the first light emitting clock signal;
a fifth transistor comprising a gate terminal for receiving the partial driving selection signal, a first terminal coupled to the other terminal of the first capacitor, and a second terminal coupled to a second power source;
a sixth transistor comprising a gate terminal coupled to the other terminal of the first capacitor and a first terminal coupled to the first power source;
a seventh transistor comprising a gate terminal for receiving the second light emitting clock signal, a first terminal coupled to a second terminal of the sixth transistor, and a second terminal coupled to the second power source;
an eighth transistor comprising a gate terminal coupled to the second terminal of the sixth transistor and a first terminal coupled to the first power source;
a ninth transistor comprising a gate terminal coupled to the other terminal of the first capacitor, a first terminal coupled to a second terminal of the eighth transistor, and a second terminal coupled to the second power source;
a tenth transistor comprising a gate terminal coupled to the second terminal of the eighth transistor and a first terminal coupled to the first power source;
a second capacitor comprising one terminal coupled to the gate terminal of the eighth transistor and another terminal coupled to a second terminal of the tenth transistor; and
an eleventh transistor comprising a gate terminal coupled to the one terminal of the second capacitor, a first terminal coupled to the other terminal of the second capacitor, and a second terminal coupled to the second power source.

7. The display device of claim 1, wherein the first partial driver comprises:
a first transistor comprising a gate terminal for receiving the first light emitting clock signal and a second terminal for receiving the third shift signal;
a second transistor comprising a gate terminal for receiving the partial driving selection signal, a first terminal coupled to a first power source, and a second terminal coupled to a first terminal of the first transistor;
a third transistor comprising a gate terminal for receiving the first light emitting clock signal and a first terminal coupled to the first power source;
a first capacitor comprising one terminal coupled to the second terminal of the second transistor and another terminal coupled to a second terminal of the third transistor;
a fourth transistor comprising a gate terminal coupled to the one terminal of the first capacitor, a first terminal coupled to the other terminal of the first capacitor, and a second terminal for receiving the second light emitting clock signal;
a fifth transistor comprising a gate terminal for receiving the partial driving selection signal, a first terminal coupled to the other terminal of the first capacitor, and a second terminal coupled to the second power source;
a sixth transistor comprising a gate terminal for receiving the inverted area selection signal and a first terminal coupled to the first power source;
a seventh transistor comprising a gate terminal coupled to the other terminal of the first capacitor and a first terminal coupled to a second terminal of the sixth transistor;
an eighth transistor comprising a gate terminal for receiving the area selection signal, a first terminal coupled to a second terminal of the seventh transistor, and a second terminal coupled to the second power source;
a ninth transistor comprising a gate terminal for receiving the first light emitting clock signal, a first terminal coupled to the second terminal of the seventh transistor, and a second terminal coupled to the second power source;
a tenth transistor comprising a gate terminal coupled to the second terminal of the seventh transistor and a first terminal coupled to the first power source;
an eleventh transistor comprising a gate terminal coupled to the other terminal of the first capacitor and a first terminal coupled to a second terminal of the tenth transistor;
a twelfth transistor comprising a gate terminal for receiving the inverted area selection signal, a first terminal coupled to a second terminal of the eleventh transistor, and a second terminal coupled to the second power source;
a thirteenth transistor comprising a gate terminal coupled to the second terminal of the tenth transistor and a first terminal coupled to the first power source;

a second capacitor comprising one terminal coupled to the gate terminal of the tenth transistor and another terminal coupled to a second terminal of the thirteenth transistor; and a fourteenth transistor comprising a gate terminal coupled to the one terminal of the second capacitor, a first terminal coupled to the other terminal of the second capacitor, and a second terminal coupled to the second power source.

8. The display device of claim 1, wherein the second partial driver comprises:

a first transistor comprising a gate terminal for receiving the second light emitting clock signal and a second terminal for receiving the fourth shift signal;

a second transistor comprising a gate terminal for receiving the partial driving selection signal, a first terminal coupled to a first power source, and a second terminal coupled to a first terminal of the first transistor;

a third transistor comprising a gate terminal for receiving the second light emitting clock signal and a first terminal coupled to the first power source;

a first capacitor comprising one terminal coupled to the second terminal of the second transistor and another terminal coupled to a second terminal of the third transistor;

a fourth transistor comprising a gate terminal coupled to the one terminal of the first capacitor, a first terminal coupled to the other terminal of the first capacitor, and a second terminal for receiving the first light emitting clock signal;

a fifth transistor comprising a gate terminal for receiving the partial driving selection signal, a first terminal coupled to the other terminal of the first capacitor, and a second terminal coupled to the second power source;

a sixth transistor comprising a gate terminal for receiving the inverted area selection signal and a first terminal coupled to the first power source;

a seventh transistor comprising a gate terminal coupled to the other terminal of the first capacitor and a first terminal coupled to a second terminal of the sixth transistor;

an eighth transistor comprising a gate terminal for receiving the area selection signal, a first terminal coupled to a second terminal of the seventh transistor, and a second terminal coupled to the second power source;

a ninth transistor comprising a gate terminal for receiving the second light emitting clock signal, a first terminal coupled to the second terminal of the seventh transistor, and a second terminal coupled to the second power source;

a tenth transistor comprising a gate terminal coupled to the second terminal of the seventh transistor and a first terminal coupled to the first power source;

an eleventh transistor comprising a gate terminal coupled to the other terminal of the first capacitor and a first terminal coupled to a second terminal of the tenth transistor;

a twelfth transistor comprising a gate terminal for receiving the inverted area selection signal, a first terminal coupled to a second terminal of the eleventh transistor, and a second terminal coupled to the second power source;

a thirteenth transistor comprising a gate terminal coupled to the second terminal of the tenth transistor and a first terminal coupled to the first power source;

a second capacitor comprising one terminal coupled to the gate terminal of the tenth transistor and another terminal coupled to a second terminal of the thirteenth transistor; and a fourteenth transistor comprising a gate terminal coupled to the one terminal of the second capacitor, a first terminal coupled to the other terminal of the second capacitor, and a second terminal coupled to the second power source.

9. A driving method of a display device comprising a display unit comprising a plurality of scan lines for transmitting a plurality of scan signals, a plurality of data lines for transmitting a plurality of data signals, a plurality of light emitting signal lines for transmitting a plurality of light emitting signals, and a plurality of pixels coupled to the plurality of scan lines, the plurality of data lines, and the plurality of light emitting signal lines, the display unit being divided into a display area and a non-display area that are fixed, the driving method comprising:

receiving, by a light emission driver, a partial driving selection signal for selecting one of a normal driving mode or a partial driving mode, an area selection signal for dividing a frame into an emission period and a non-emission period, a synchronization signal generated in synchronization with a vertical synchronization signal, a first light emitting clock signal, and a second light emitting clock signal in which the first light emitting clock signal is inverted;

transmitting, by the light emission driver, first light emitting signals of the plurality of light emitting signals at an on voltage level to a plurality of first light emitting signal lines corresponding to the non-display area and a plurality of second light emitting signal lines corresponding to the display area among the plurality of light emitting signal lines under the normal driving mode; and transmitting second light emitting signals of the plurality of light emitting signals at an off voltage level to the plurality of first light emitting signal lines under the partial driving mode, and transmitting, by the light emission driver, third light emitting signals of the plurality of light emitting signals at the on voltage level to the plurality of second light emitting signal lines according to the area selection signal under the partial driving mode, wherein the light emission driver comprises a plurality of partial drivers respectively coupled to the plurality of second light emitting signal lines, for outputting the first light emitting signals to the second light emitting signal lines under the normal driving mode and the third light emitting light signals to the second light emitting signal lines according to the area selection signal under the partial driving mode, and wherein the plurality of partial drivers comprises:

a first partial driver for receiving the first light emitting clock signal, the second light emitting clock signal, the area selection signal, an inverted area selection signal in which the area selection signal is inverted, the partial driving selection signal, and a third shift signal, and for generating a third light emitting signal of the plurality of light emitting signals at a second power source voltage according to the area selection signal when the partial driving selection signal is at a second level; and a second partial driver for receiving the first light emitting clock signal, the second light emitting clock signal, the area selection signal, the inverted area selection signal, and a fourth shift signal, and for generating a fourth light emitting signal of the plurality of light emitting signals at the second power source voltage according to the area selection signal.

10. The driving method of claim 9, wherein the transmitting of the first light emitting signals at the on voltage level comprises:
receiving the second light emitting clock signal in accordance with the synchronization signal when the partial driving selection signal indicates the normal driving mode, and transmitting a first shift signal and a first light emitting signal of the first light emitting signals by inverting the first shift signal according to the second light emitting clock signal; and
receiving the first light emitting clock signal in accordance with the first shift signal when the partial driving selection signal indicates the normal driving mode, and transmitting a second shift signal and a second light emitting signal of the first light emitting signals by inverting the second shift signal according to the first light emitting clock signal.

11. The driving method of claim 9, wherein the transmitting of the second light emitting signals at the off voltage level comprises maintaining the synchronization signal and the first and second light emitting clock signals at a voltage level when the partial driving selection signal indicates the partial driving mode.

12. A display device comprising:
a display unit comprising a plurality of scan lines for transmitting a plurality of scan signals, a plurality of data lines for transmitting a plurality of data signals, a plurality of light emitting signal lines for transmitting a plurality of light emitting signals, and a plurality of pixels coupled to the plurality of scan lines, the plurality of data lines, and the plurality of light emitting signal lines, the display unit being divided into a display area and a non-display area that are fixed; and
a light emission driver for receiving an area selection signal for dividing the display unit into the display area and the non-display area, and an inverted area selection signal in which the area selection signal is inverted, and for generating a first light emitting signal corresponding to the display area at an on voltage level, and a second light emitting signal corresponding to the non-display area at an off voltage level among the plurality of light emitting signals according to at least two scan signals of the plurality of scan signals,
wherein the light emission driver comprises a plurality of light emitting signal generators respectively coupled to the plurality of light emitting signal lines, for generating the second light emitting signal of the off voltage level according to the inverted area selection signal and a corresponding first scan signal of the at least two scan signals, and for generating the first light emitting signal of the on voltage level according to the area selection signal and a corresponding second scan signal of the at least two scan signals generated following the first scan signal, and
wherein each of the plurality of light emitting signal generators comprises:
a first transistor comprising a gate terminal for receiving the first scan signal and a first terminal coupled to a first power source;
a second transistor comprising a gate terminal for receiving the second scan signal and a first terminal coupled to a second terminal of the first transistor;
a third transistor comprising a gate terminal for receiving the area selection signal, a first terminal coupled to a second terminal of the second transistor, and a second terminal coupled to a second power source;
a fourth transistor comprising a gate terminal for receiving the inverted area selection signal, a first terminal coupled to the first power source, and a second terminal coupled to the second terminal of the first transistor;
a fifth transistor comprising a gate terminal coupled to the second terminal of the fourth transistor and a first terminal coupled to the first power source;
a first capacitor comprising one terminal coupled to the first power source and another terminal coupled to a second terminal of the fifth transistor;
a sixth transistor comprising a gate terminal for receiving the first scan signal, a first terminal coupled to the second terminal of the fifth transistor, and a second terminal coupled to the second power source;
a seventh transistor comprising a gate terminal for receiving the inverted area selection signal, a first terminal coupled to the other terminal of the first capacitor, and a second terminal coupled to the second power source;
an eighth transistor comprising a gate terminal coupled to the other terminal of the first capacitor and a first terminal coupled to the first power source;
a ninth transistor comprising a gate terminal coupled to the gate terminal of the fifth transistor, a first terminal coupled to a second terminal of the eighth transistor, and a second terminal coupled to the second power source; and
a second capacitor comprising one terminal coupled to the gate terminal of the ninth transistor and another terminal coupled to the first terminal of the ninth transistor.

13. The display device of claim 12, further comprising a scan driver for receiving a synchronization signal in synchronization with a vertical synchronization signal, a first light emitting clock signal, a second light emitting clock signal in which the first light emitting clock signal is shifted by half a cycle, a first initialization signal having a phase delay from the second light emitting clock signal, and a second initialization signal having the phase delay from the first light emitting clock signal, for sequentially generating the plurality of scan signals.

14. The display device of claim 13, wherein the scan driver comprises:
a plurality of first scan signal generators for outputting one of the second light emitting clock signal or a first power source voltage as a plurality of first scan signals according to the first initialization signal and a first input signal input in synchronization with the first light emitting clock signal; and
a plurality of second scan signal generators for outputting one of the first light emitting clock signal or the first power source voltage as a plurality of second scan signals according to the second initialization signal and a second input signal input in synchronization with the second light emitting clock signal.

15. The display device of claim 14, wherein for each first scan signal generator of the plurality of first scan signal generators, the first input signal is the synchronization signal or one of the plurality of second scan signals output from one of the plurality of second scan signal generators that is earlier than and adjacent to the first scan signal generator.

16. The display device of claim 14, wherein for each second scan signal generator of the plurality of second scan signal generators, the second input signal is one of the plurality of first scan signals output from one of the first scan signal generators that is earlier than and adjacent to the second scan signal generator.

17. The display device of claim 12, further comprising a data driver for transmitting valid data of the plurality of data signals to the plurality of data lines when driving the display area and for transmitting invalid data of the plurality of data signals to the plurality of data lines when driving the non-display area.

18. The display device of claim 17, wherein the data driver is configured to transmit the valid data to the plurality of data lines during a period in which the area selection signal corresponding to the display area is applied, and to transmit the invalid data to the plurality of data lines during a period in which the area selection signal corresponding to the non-display area is applied.

* * * * *